(12) United States Patent
Shim et al.

(10) Patent No.: US 9,318,486 B2
(45) Date of Patent: Apr. 19, 2016

(54) SEMICONDUCTOR INTEGRATED CIRCUIT DEVICES

(71) Applicant: Samsung Electronics Co., Ltd., Suwon-si (KR)

(72) Inventors: Woo-Seok Shim, Osan-si (KR); Young-Chang Kim, Seoul (KR); Dong-Geon Kim, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/511,532

(22) Filed: Oct. 10, 2014

(65) Prior Publication Data

US 2015/0287718 A1  Oct. 8, 2015

(30) Foreign Application Priority Data

Apr. 8, 2014  (KR) ........................ 10-2014-0041613

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 27/088* | (2006.01) |
| *H01L 27/092* | (2006.01) |
| *H01L 27/02* | (2006.01) |

(52) U.S. Cl.
CPC .......... *H01L 27/088* (2013.01); *H01L 27/0207* (2013.01); *H01L 27/092* (2013.01)

(58) Field of Classification Search
CPC ............................. H01L 27/088; H01L 27/092
USPC ........................................................... 257/369
See application file for complete search history.

(56) References Cited

U.S. PATENT DOCUMENTS

| | | | |
|---|---|---|---|
| 5,598,347 | A | 1/1997 | Iwasaki |
| 6,477,695 | B1 | 11/2002 | Gandhi |
| 7,640,522 | B2 | 12/2009 | Gupta et al. |
| 7,712,064 | B2 | 5/2010 | Scheffer et al. |
| 7,873,929 | B2 | 1/2011 | Kahng et al. |

(Continued)

OTHER PUBLICATIONS

Brochure Entitled "Standard Cell Layout" from http://www.pldworld.com/_hdl/1/erc.msstate.edu/www/mpl/cddd/html/proposal/stdcell.html, retrieved on Sep. 11, 2013, 9 pages.

(Continued)

*Primary Examiner* — David S Blum
(74) *Attorney, Agent, or Firm* — Myers Bigel & Sibley, P.A.

(57) ABSTRACT

A semiconductor integrated circuit device may include a standard cell region on a surface of a substrate and a first active region on the surface of the substrate in the standard cell region, wherein the first active region has a length in a first direction. A second active region may be on the surface of the substrate in the standard cell region, the second active region may have a length in the first direction, the length of the second active region may be greater than the length of the first active region, and an axis in a second direction may intersect centers of the first and second active regions so that the first and second active regions are symmetric about the axis in the second direction. A first gate electrode may extend across the first active region in the first direction, and a second gate electrode may extend across the second active region in the first direction.

20 Claims, 12 Drawing Sheets

(56) References Cited

U.S. PATENT DOCUMENTS

| | | |
|---|---|---|
| 7,919,792 B2 | 4/2011 | Law et al. |
| 8,185,847 B2 | 5/2012 | Robles et al. |
| 8,312,397 B2 | 11/2012 | Inoue |
| 8,859,357 B2 * | 10/2014 | Choi .................. H01L 29/1033 438/128 |
| 2005/0218459 A1 * | 10/2005 | Satsukawa .......... H01L 27/0207 257/379 |
| 2005/0251771 A1 | 11/2005 | Robles |
| 2013/0042216 A1 | 2/2013 | Loh et al. |

OTHER PUBLICATIONS

Kelin J. Kuhn "Reducing Variation in Advanced Logic Technologies: Approaches to Process and Design for Manufacturability of Nanoscale CMOS", Logic Technology Development, Intel Corporation, Hillsboro, OR 97124, U.S.A., Electronic Devices Meeting, Dec. 10-12, 2007, pp. 471-474.

Kelin J. Kuhn "Reducing Variation in Advanced Logic Technologies: Approaches to Process and Design for Manufacturability of Nanoscale CMOS" PowerPoint Presentation by Kelin J. Kuhn, Intel Fellow, Director of Logic Device Technology, Portland Technology Development, Intel Corporation, Dec. 11, 2007, 40 pages.

* cited by examiner

FIG. 8
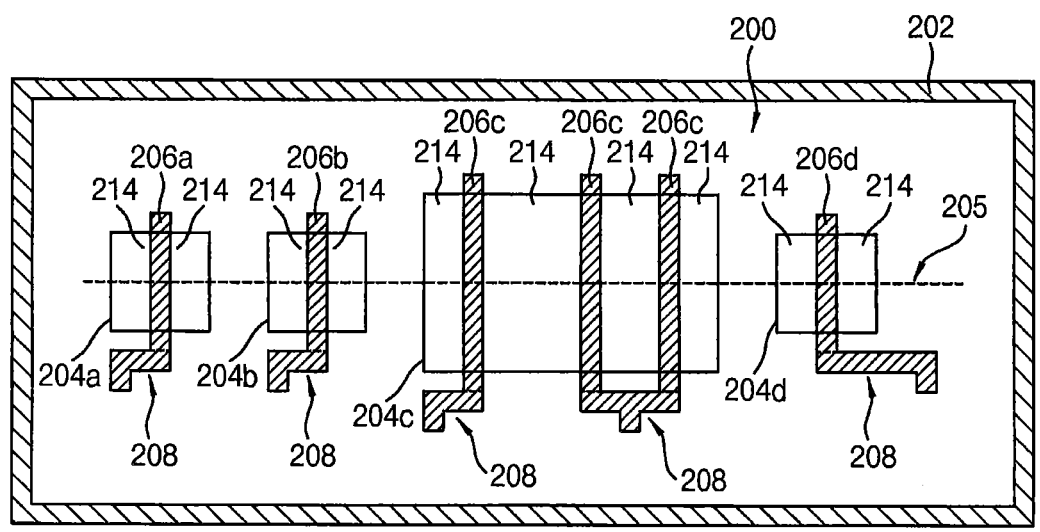
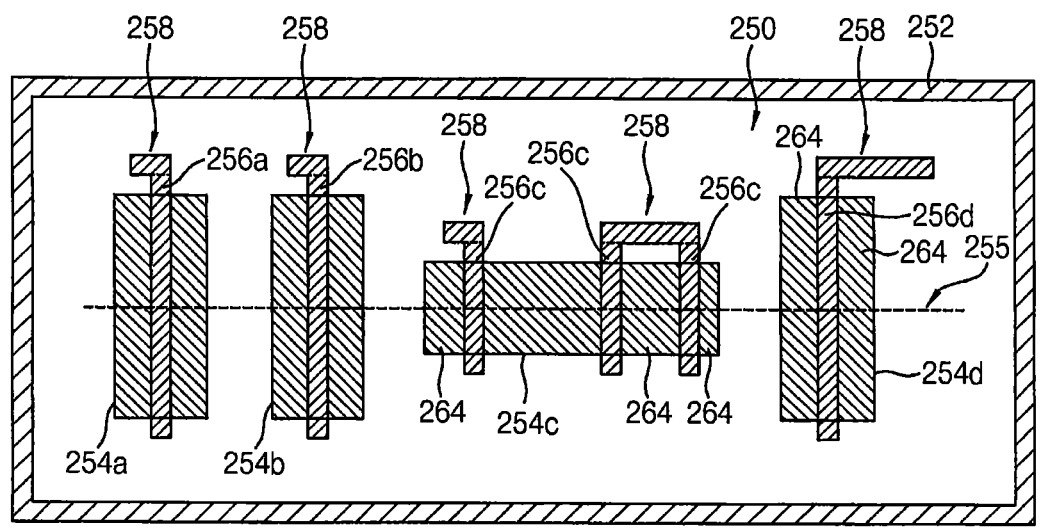
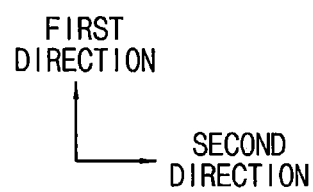

FIG. 9
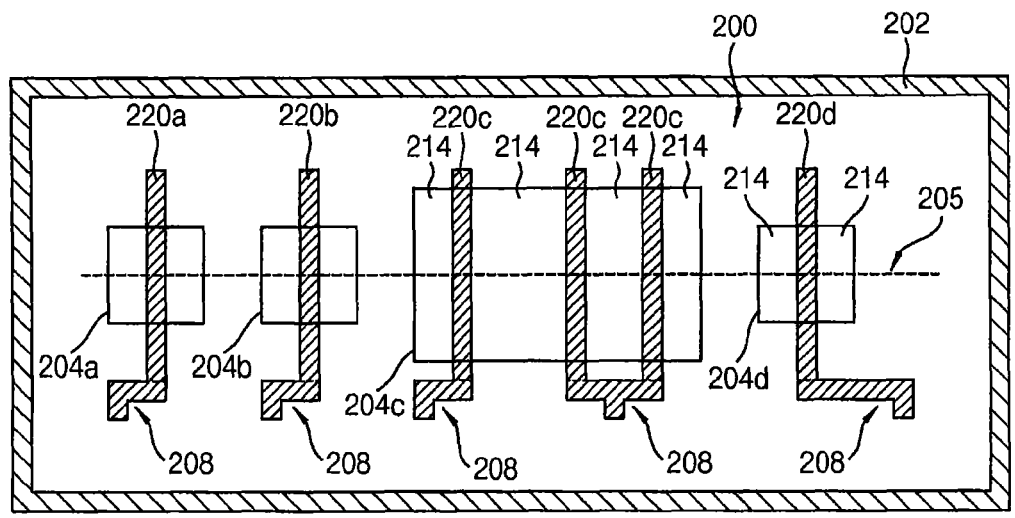
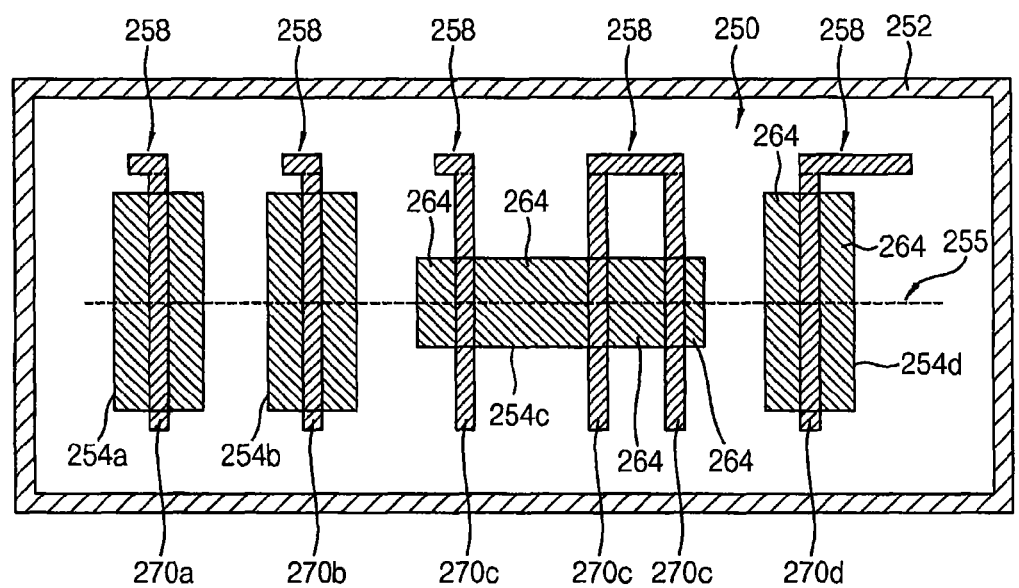
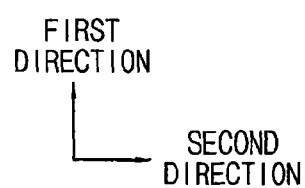

FIG. 10
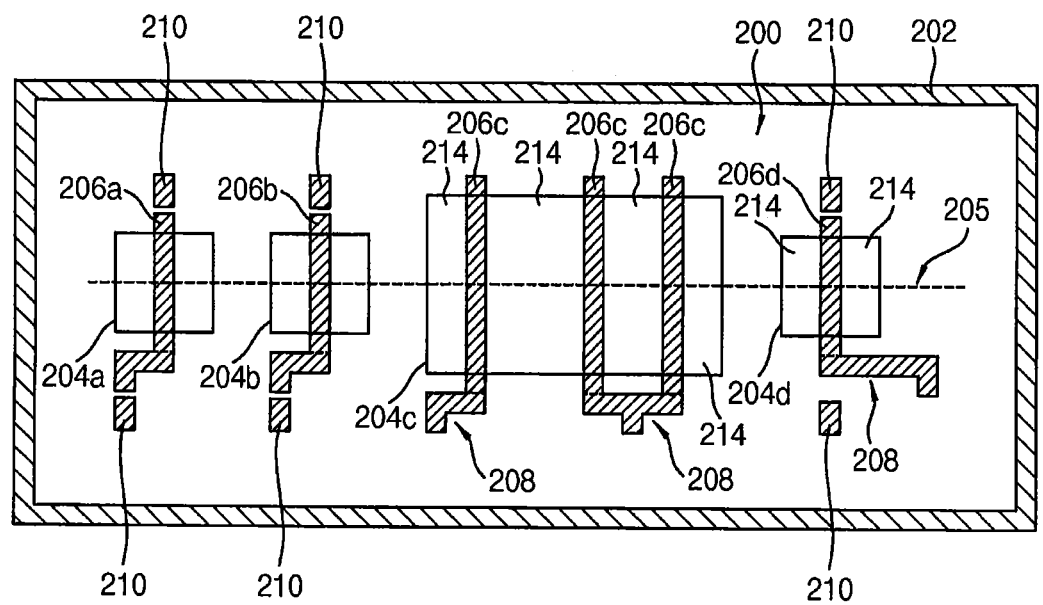
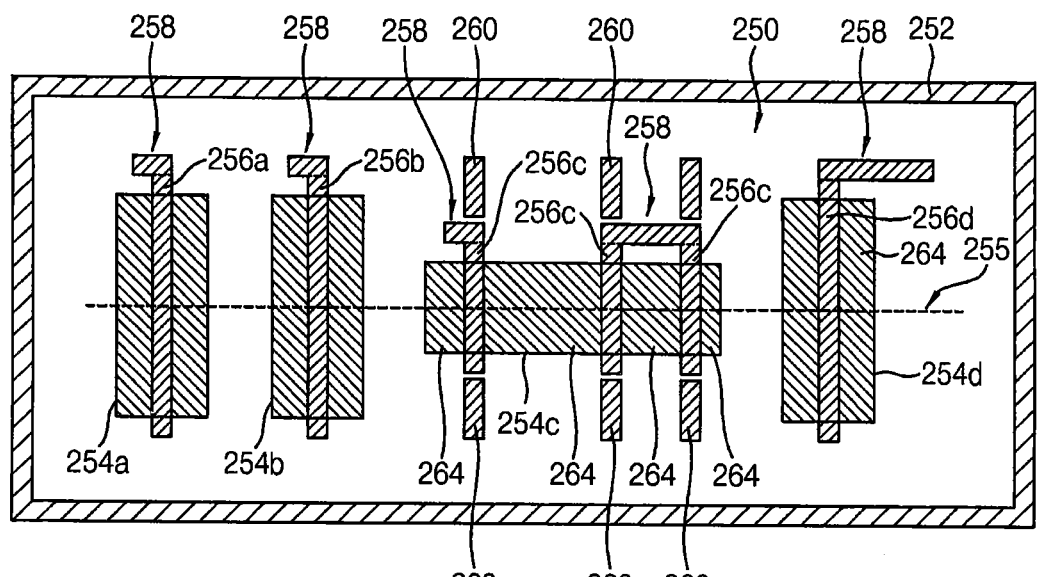
FIRST DIRECTION
SECOND DIRECTION

SEMICONDUCTOR INTEGRATED CIRCUIT DEVICES

CROSS-REFERENCE TO RELATED APPLICATION

This application claims priority under 35 USC §119 to Korean Patent Application No. 10-2014-0041613, filed on Apr. 8, 2014 in the Korean Intellectual Property Office (KIPO), the disclosure of which is herein incorporated by reference in its entirety.

BACKGROUND

The present application relates in general to electronic device structures, and more particularly, to transistor structures for semiconductor integrated circuit devices.

Patterns of MOS transistors in an integrated circuit device may need to be formed to have accurate sizes/dimensions so that the MOS transistors may provide desired operational characteristics. Due to the high integration of semiconductor devices, however, MOS transistors having a designed layout may be difficult to form on a substrate, even though correction (e.g., optical proximity correction OPC, process proximity correction PPC, etc.) may be performed for photolithography operations.

SUMMARY

According to some embodiments of inventive concepts, a semiconductor integrated circuit device may include a standard cell region on a surface of a substrate and a first active region on the surface of the substrate in the standard cell region, wherein the first active region has a length in a first direction. A second active region may be on the surface of the substrate in the standard cell region, the second active region may have a length in the first direction, the length of the second active region may be greater than the length of the first active region, and an axis in a second direction may intersect centers of the first and second active regions so that the first and second active regions are symmetric about the axis in the second direction. A first gate electrode may extend across the first active region in the first direction, and a second gate electrode may extend across the second active region in the first direction.

A guard ring may surround the standard cell region, wherein the guard ring includes first and second sides extending in the first direction and third and fourth sides extending in the second direction. Moreover, the first and second directions may be orthogonal.

A length of the first gate electrode in the first direction may be greater than the length of the first active region in the first direction, and a length of the second gate electrode in the first direction may be greater than the length of the second active region in the first direction. The length of the first gate electrode in the first direction may be less than the length of the second gate electrode in the first direction. The length of the first gate electrode in the first direction may be less than the length of the second active region in the first direction. First and second dummy gate patterns may be provided at opposite ends of the first gate electrode and spaced apart from the first gate electrode, so that the first gate electrode is arranged between the first and second dummy gate patterns in the first direction. The lengths of the first and second gate electrodes in the first direction may be the same.

The standard cell region may be a first standard cell region and the axis may be a first axis. In addition, first and second source/drain regions may be provided in the first active region on opposite sides of the first gate electrode wherein the first active region, the first gate electrode, and the first and second source/drain regions define a first MOS transistor of a first conductivity type. Third and fourth source/drain regions may be provided in the second active region on opposite sides of the second gate electrode wherein the second active region, the second gate electrode, and the third and fourth source/drain regions define a second NMOS transistor of the first conductivity type. A second standard cell region may be provided on the surface of a substrate, a third active region may be provided on the surface of the substrate in the second standard cell region, a fourth active region may be provided on the surface of the substrate in the second standard cell region, a third gate electrode may extend across the third active region in the first direction, and a fourth gate electrode may extend across the fourth active region in the first direction. Fifth and sixth source/drain regions may be provided in the third active region on opposite sides of the third gate electrode wherein the third active region, the third gate electrode, and the fifth and sixth source/drain regions define a first MOS transistor of a second conductivity type different than the first conductivity type. Seventh and eighth source/drain regions may be provided in the fourth active region on opposite sides of the fourth gate electrode wherein the fourth active region, the fourth gate electrode, and the seventh and eighth source/drain regions define a second MOS transistor of the second conductivity type.

A field region may be provided on the surface of the substrate in the standard cell region surrounding the first and second active regions. A dummy gate pattern may be provided on the field region between the first and second active regions, wherein the dummy gate pattern extends across the field region in the first direction in parallel with the first and second gate electrodes. Moreover, a distance between the first gate electrode and the dummy gate pattern in the second direction may be the same as a distance between the dummy gate pattern and the second gate electrode in the second direction.

The axis in the second direction may intersect centers of the first and second gate electrodes so that the first and second gate electrodes are symmetric about the axis in the first direction. Moreover, lengths of the first and second gate electrodes in the first direction are different.

According to some other embodiments of inventive concepts, a semiconductor integrated circuit device may include a standard cell region on a surface of a substrate, a first active region on the surface of the substrate in the standard cell region wherein the first active region has a length in a first direction, and a second active region on the surface of the substrate in the standard cell region wherein the second active region has a length in the first direction and wherein the length of the second active region is greater than the length of the first active region. A first gate electrode may extend across the first active region in the first direction wherein the first gate electrode has a length in the first direction, and a second gate electrode may extend across the second active region in the first direction wherein the second gate electrode has a length in the first direction that is greater than the length of the first gate electrode in the first direction. A first dummy gate pattern may be spaced apart from the first gate electrode, and a second dummy gate pattern may be spaced apart from the first gate electrode wherein the first gate electrode is arranged between the first and second dummy gate patterns in the first direction.

A guard ring may surround the standard cell region, and the guard ring may include first and second sides extending in the first direction and third and fourth sides extending in a second direction. The first and second directions may be orthogonal.

A length of the first gate electrode in the first direction may be greater than the length of the first active region in the first direction, and a length of the second gate electrode in the first direction may be greater than the length of the second active region in the first direction. The length of the first gate electrode in the first direction may be less than the length of the second active region in the first direction.

An axis in the second direction may intersect centers of the first and second gate electrodes so that the first and second gate electrodes are symmetric about the axis in the second direction.

A distance between an end of the first dummy gate pattern and an edge of the standard cell region in the first direction may be the same as a distance between an end of the second gate electrode and the edge of the standard cell region in the first direction.

The standard cell region may be a first standard cell region. First and second source/drain regions may be provided in the first active region on opposite sides of the first gate electrode wherein the first active region, the first gate electrode, and the first and second source/drain regions define a first MOS transistor of a first conductivity type. Third and fourth source/drain regions may be provided in the second active region on opposite sides of the second gate electrode wherein the second active region, the second gate electrode, and the third and fourth source/drain regions define a second NMOS transistor of the first conductivity type. A second standard cell region may be provided on the surface of a substrate, a third active region may be provided on the surface of the substrate in the second standard cell region, and a fourth active region may be provided on the surface of the substrate in the second standard cell region. A third gate electrode may extend across the third active region in the first direction, and a fourth gate electrode may extend across the fourth active region in the first direction. Fifth and sixth source/drain regions may be provided in the third active region on opposite sides of the third gate electrode wherein the third active region, the third gate electrode, and the fifth and sixth source/drain regions define a first MOS transistor of a second conductivity type different than the first conductivity type. Seventh and eighth source/drain regions may be provided in the fourth active region on opposite sides of the fourth gate electrode wherein the fourth active region, the fourth gate electrode, and the seventh and eighth source/drain regions define a second MOS transistor of the second conductivity type.

A field region may be provided on the surface of the substrate in the standard cell region surrounding the first and second active regions. A dummy gate pattern may be provided on the field region between the first and second active regions, wherein the dummy gate pattern extends across the field region in the first direction in parallel with the first and second gate electrodes. A distance between the first gate electrode and the dummy gate pattern in the second direction may be the same as a distance between the dummy gate pattern and the second gate electrode in the second direction.

According to still other embodiments of inventive concepts, a semiconductor integrated circuit device may include a standard cell region on a surface of a substrate, a first active region on the surface of the substrate in the standard cell region, a second active region on the surface of the substrate in the standard cell region, and a field region may be provided on the surface of the substrate in the standard cell region surrounding the first and second active regions. A first gate electrode may extend across the first active region in the first direction, and a second gate electrode may extend across the second active region in the first direction. A dummy gate pattern may be provided on the field region between the first and second active regions, the dummy gate pattern may extend across the field region in the first direction in parallel with the first and second gate electrodes, and an axis in the second direction may intersect center points of the first gate electrode, the second gate electrode, and the dummy gate pattern.

The first gate electrode, the second gate electrode, and the dummy gate electrode may be symmetric in the direction about the axis.

A distance between the first gate electrode and the dummy gate pattern in a second direction may be the same as a distance between the dummy gate pattern and the second gate electrode in the second direction. The first and second directions may be orthogonal.

A guard ring may surround the standard cell region, wherein the guard ring includes first and second sides extending in the first direction and third and fourth sides extending in the second direction.

A length of the first gate electrode in the first direction may be greater than the length of the first active region in the first direction, and a length of the second gate electrode in the first direction may be greater than the length of the second active region in the first direction. The length of the first gate electrode in the first direction may be less than the length of the second active region in the first direction.

A distance between an end of the dummy gate pattern and an edge of the standard cell region in the first direction may be the same as a distance between an end of the second gate electrode and the edge of the standard cell region in the first direction.

The standard cell region may be a first standard cell region. First and second source/drain regions may be provided in the first active region on opposite sides of the first gate electrode wherein the first active region, the first gate electrode, and the first and second source/drain regions define a first MOS transistor of a first conductivity type. Third and fourth source/drain regions may be provided in the second active region on opposite sides of the second gate electrode wherein the second active region, the second gate electrode, and the third and fourth source/drain regions device a second NMOS transistor of the first conductivity type. A second standard cell region may be provided on the surface of a substrate, a third active region may be provided on the surface of the substrate in the second standard cell region, and a fourth active region may be provided on the surface of the substrate in the second standard cell region. A third gate electrode may extend across the third active region in the first direction, and a fourth gate electrode may extend across the fourth active region in the first direction. Fifth and sixth source/drain regions may be provided in the third active region on opposite sides of the third gate electrode wherein the third active region, the third gate electrode, and the fifth and sixth source/drain regions define a first MOS transistor of a second conductivity type different than the first conductivity type. Seventh and eighth source/drain regions may be provided in the fourth active region on opposite sides of the fourth gate electrode wherein the fourth active region, the fourth gate electrode, and the seventh and eighth source/drain regions define a second MOS transistor of the second conductivity type. The first active region may have a length in a first direction, the second active region may have a length in the first direction, the length of the second active region may be greater than the length of the first active region, the first gate electrode may have a length in the first direction, and the second gate electrode may have a length in the first direction that is greater than the length of the first gate electrode in the first direction.

BRIEF DESCRIPTION OF THE DRAWINGS

Example embodiments will be more clearly understood from the following detailed description taken in conjunction with the accompanying drawings. FIGS. 1 to 12 represent non-limiting, example embodiments as described herein.

FIG. 1 is a plan view illustrating a semiconductor integrated circuit device in accordance with example embodiments;

FIG. 2 is a plan view illustrating a layout of active regions of the semiconductor integrated circuit device in FIG. 1;

FIG. 3 is a plan view illustrating a semiconductor integrated circuit device in accordance with example embodiments;

FIG. 4 is a plan view illustrating a semiconductor integrated circuit device in accordance with example embodiments;

FIG. 5 is a plan view illustrating a semiconductor integrated circuit device in accordance with example embodiments;

FIG. 6 is a plan view illustrating a semiconductor integrated circuit device in accordance with example embodiments;

FIG. 7 is a plan view illustrating a semiconductor integrated circuit device in accordance with example embodiments;

FIG. 8 is a plan view illustrating a semiconductor integrated circuit device in accordance with example embodiments;

FIG. 9 is a plan view illustrating a semiconductor integrated circuit device in accordance with example embodiments;

FIG. 10 is a plan view illustrating a semiconductor integrated circuit device in accordance with example embodiments;

FIG. 11 is a plan view illustrating a semiconductor integrated circuit device in accordance with example embodiments; and FIG. 12 is a plan view illustrating a semiconductor integrated circuit device in accordance with example embodiments.

DESCRIPTION OF EMBODIMENTS

Figure 1:
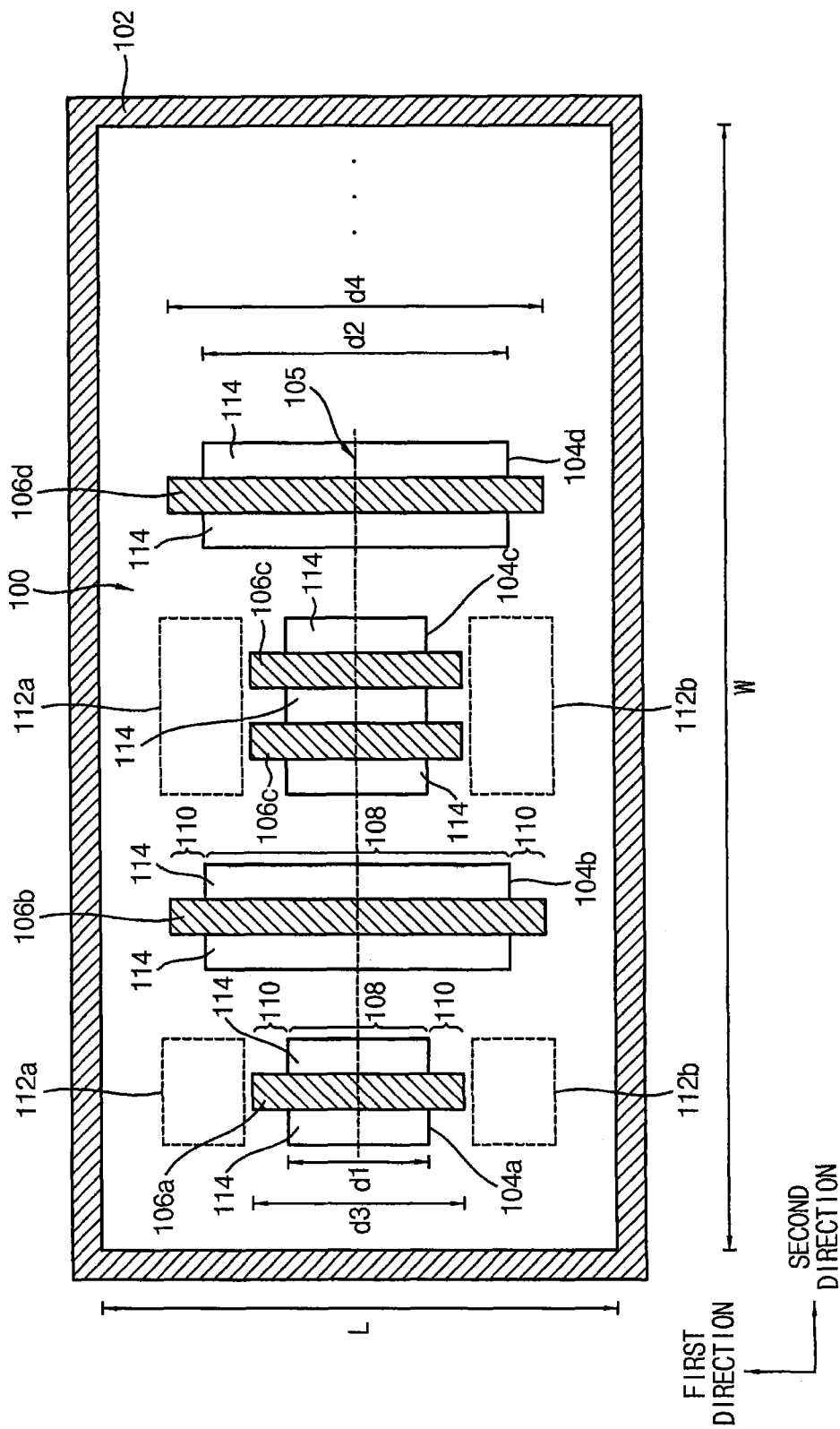

Various example embodiments will be described more fully hereinafter with reference to the accompanying drawings, in which some example embodiments are shown. Present inventive concepts may, however, be embodied in many different forms and should not be construed as limited to the example embodiments set forth herein. Rather, these example embodiments are provided so that this description will be thorough and complete, and will fully convey the scope of present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which present inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A semiconductor integrated circuit may include a plurality of unit (logic) circuits, e.g., NAND circuits, NOR circuits, invertors, etc. The unit circuits may be arranged in a standard cell region, which may form a standard cell. The standard cell region may be disposed in a peripheral region of the semiconductor integrated circuit. The standard cell may have various shapes within a design rule to maintain operational characteristics thereof. Hereinafter, a standard cell including a transistor will be illustrated.

Figure 2:
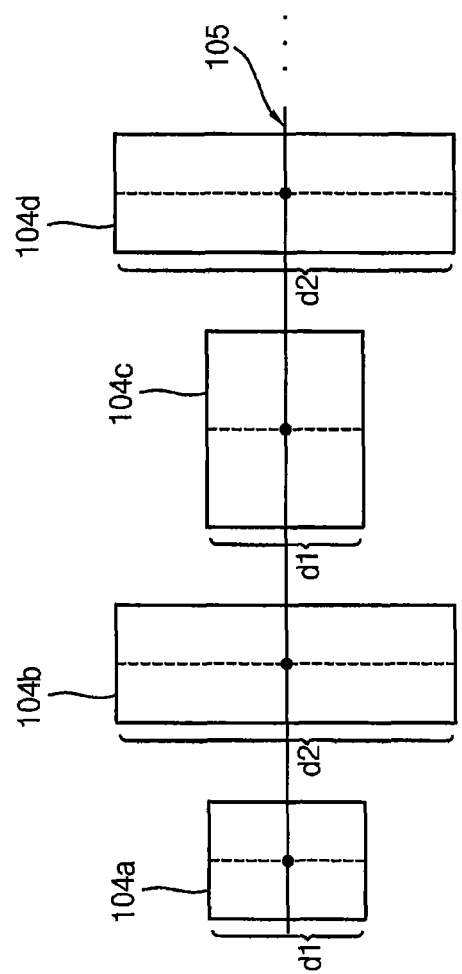

FIG. 1 is a plan view illustrating a semiconductor integrated circuit in accordance with example embodiments. FIG. 2 is a plan view illustrating a layout of active regions of the semiconductor integrated circuit in FIG. 1.

Referring to FIGS. 1 and 2, the semiconductor integrated circuit may include a standard cell region 100, active regions 104a, 104b, 104c and 104d, gate electrodes 106a, 106b, 106c and 106d, and impurity regions 114. That is, the semiconductor integrated circuit may include MOS transistors in the active regions 104a, 104b, 104c and 104d, respectively.

The standard cell region 100 in which a standard cell may be formed may be defined on a substrate (not shown). The standard cell region 100 may have a fixed length L in a first direction substantially parallel to a top surface of the substrate and a variable width W in a second direction substantially parallel to the top surface of the substrate and substantially perpendicular to the first direction. Each cell in the standard cell region 100 may be designed to have a limited size in the first direction because the standard cell region 100 may have the fixed length L in the first direction. However, a size of each cell in the standard cell region 100 in the second direction may be variable (i.e., not limited). As the standard cell region 100 may have the fixed length L in the first direction, a space used to form the cells may be simplified. The standard cell region 100 may be defined as a region surrounded by a guard ring 102, which may be doped with impurities and which may have a rectangular ring shape.

The active regions 104a, 104b, 104c and 104d may be arranged in the standard cell region 100 in the second direction. Each of the active regions 104a, 104b, 104c and 104d may have a rectangular shape. At least one of the active regions 104a, 104b, 104c and 104d may have a length in the first direction different from a length/lengths of another/others. The active regions 104a, 104b, 104c and 104d may be surrounded by a field region in the substrate so as to be divided from each other. At least one MOS transistor may be formed in each of the active regions 104a, 104b, 104c and 104d.

Center points of the active regions 104a, 104b, 104c and 104d in the first direction may be located on a first straight line 105 (also referred to as an axis) extending in the second direction. Therefore, each of the active regions 104a, 104b, 104c and 104d may be symmetric with respect to the first straight line 105.

Hereinafter, reference numerals 104a, 104b, 104c and 104d may indicate first, second, third and fourth active regions, respectively, for the convenience of explanation. In example embodiments, each of the first and third active regions 104a and 104c may have a first length d1 in the first direction, and each of the second and fourth active regions 104b and 104d may have a second length d2 in the first direction greater than the first length d1. However, numbers and lengths of the active regions are not limited to embodiments discussed above.

The gate electrodes 106a, 106b, 106c and 106d may extend in the first direction on the active regions 104a, 104b, 104c and 104d, respectively. End portions of each of the gate electrodes 106a, 106b, 106c and 106d in the first direction may be disposed on portions of the field region adjacent to end portions of each of the active regions 104a, 104b, 104c and 104d in the first direction. In example embodiments, the end portions of each of the gate electrodes 106a, 106b, 106c and 106d may be spaced apart from the end portions of each of the active regions 104a, 104b, 104c and 104d by a given distance, respectively.

Each of the gate electrodes 106a, 106b, 106c and 106d may include a first portion 108 and a second portion 110. The first portion 108 may be disposed on each of the active regions 104a, 104b, 104c and 104d, and the second portion 110 may be disposed on the field region. The first portion 108 may serve as an effective gate electrode for switching operation(s), and the second portion(s) 110 may serve as an extended portion(s) of the effective gate electrode. Therefore, a width of the first portion 108 of each of the gate electrodes 106a, 106b, 106c and 106d in the second direction may be uniform along the first direction so that the MOS transistors including the gate electrodes 106a, 106b, 106c and 106d may have proper operation characteristics.

At least one gate electrode may be formed on each of the active regions 104a, 104b, 104c and 104d. Hereinafter, reference numerals 106a, 106b, 106c and 106d may indicate first, second, third and fourth gate electrodes, respectively, for the convenience of explanation. That is, the first to fourth gate electrodes 106a, 106b, 106c and 106d may be formed on the first to fourth active regions 104a, 104b, 104c and 104d, respectively. In example embodiments, one first gate electrode 106a, one second gate electrode 106b and one fourth gate electrode 106d may be formed on the first, second and fourth active regions 104a, 104b and 104d, respectively, and two third gate electrodes 106c may be formed on the third active region 104c.

The first to fourth gate electrodes 104a, 104b, 104c and 104d may have widths in the second direction that are substantially the same as or different from each other. However, a width in the second direction of each of the gate electrodes 104a, 104b, 104c and 104d may be uniform in the first direction. That is, the first and second portions 108 and 110 of each of the gate electrodes 104a, 104b, 104c and 104d may have a width in the second direction that may be uniform in the first direction.

A respective pad electrode (not shown) may be connected with the second portion 110 of each of the gate electrodes 104a, 104b, 104c and 104d on the field region. The pad electrode may have a width in the second direction that may not be uniform in the first direction, or that may be different from that of the first and second portions 108 and 110.

The first to fourth gate electrodes 106a, 106b, 106c and 106d may be arranged in the second direction. Center points of the first to fourth gate electrodes 106a, 106b, 106c and 106d in the first direction may be located on a second straight line extending in the second direction (e.g., line 105). Referring to FIG. 1, the second straight line may be identical to the first straight line 105. Alternatively, the second straight line may be different from (e.g., offset from) the first straight line 105. Each of the first to fourth gate electrodes 106a, 106b, 106c and 106d may be symmetric with respect to the second straight line.

At least one of the first to fourth gate electrodes 106a, 106b, 106c and 106d may have a length in the first direction different from a length/lengths of another/others. The first to fourth gate electrodes 106a, 106b, 106c and 106d may have lengths in the first direction greater than lengths of the first to fourth active regions 104a, 104b, 104c and 104d, respectively. Thus, the lengths of the gate electrodes 106a, 106b, 106c and 106d may be changeable according to the lengths of the active regions 104a, 104b, 104c and 104d thereunder, respectively. Each of the first and third gate electrodes 106a and 106c may have a third length d3 in the first direction greater than the first length d1, and each of the third and fourth gate electrodes 106a and 106c may have a fourth length d4 in the first direction greater than the second length d2. Also, the third length d3 may be smaller than the fourth length d4.

A pattern density in the standard cell region 100 may not be uniform because the lengths of the first to fourth gate electrodes 106a, 106b, 106c and 106d may be different from each other. Both portions of the field region adjacent to both end portions of each of the first and third gate electrodes 106a and 106c having a relatively short length may be referred to as loading effect areas 112a and 112b, respectively, on which no gate electrode is formed. As differences between the lengths of the first to fourth gate electrodes 106a, 106b, 106c and 106d in the first direction increase, lengths of the loading effect areas 112a and 112b in the first direction may increase. Hereinafter, reference numerals 112a and 112b may indicate first and second loading effect areas 112a and 112b, respectively.

In an etching process used to form the gate electrodes 106a, 106b, 106c and 106d, a loading effect may occur in the first and second loading effect areas 112a and 112b. As the lengths of the loading effect areas 112a and 112b increase, the loading effect may be more pronounced, and thus the widths of the gate electrodes 106a, 106b, 106c and 106d in the second direction may not be uniform.

In example embodiments, the center points in the first direction of the first to fourth gate electrodes 106a, 106b, 106c and 106d may be aligned with the second straight line, so that the loading effect areas may be formed on portions of the field region adjacent to both end portions of each of the first and third gate electrodes 106a and 106c. Thus, the loading effect areas may be evenly divided into two, i.e., the first and second loading effect areas 112a and 112b, so that each of the first and second loading effect areas 112a and 112b may have a reduced length and size. Therefore, the loading effect may be reduced during the etching process used to form the gate electrodes 106a, 106b, 106c and 106d. Also, each of the gate electrodes 106a, 106b, 106c and 106d may be formed to have a uniform width in the second direction.

If center points in the first direction of gate electrodes are not aligned with a straight line 105, and each gate electrode is disposed to be closer to one side of the standard cell region in the first direction, a larger loading effect area may be formed at a portion of the field region adjacent to only one end portions of the gate electrode in the standard cell region. Thus, the loading effect area of one end of a gate electrode may have a long length and a great size. In contrast, a length of each of the first and second loading effect areas 112a and 112b in accordance with example embodiments may be about half of the above length of the larger loading effect area.

The impurity regions 114 may be formed at upper portions of each of the active regions 104a, 104b, 104c and 104d adjacent to (and on opposite sides of) the gate electrodes 106a, 106b, 106c and 106d, respectively. The impurity regions 114 may serve as source/drain regions of each of the MOS transistors.

As discussed above, in accordance with example embodiments, the center points in the first direction of each of the active regions 104a, 104b, 104c and 104d may be located on the first straight line 105 extending in the second direction, and the center points in the first direction of each of the gate electrodes 106a, 106b, 106c and 106d on the active regions 104a, 104b, 104c and 104d, respectively, may be located on the second straight line extending in the second direction. Due to the above-described layout of the active regions 104a, 104b, 104c and 104d and the gate electrodes 106a, 106b, 106c and 106d, the semiconductor integrated circuit may have a reduced loading effect, and may have desired and/or improved operation characteristics.

Figure 3:
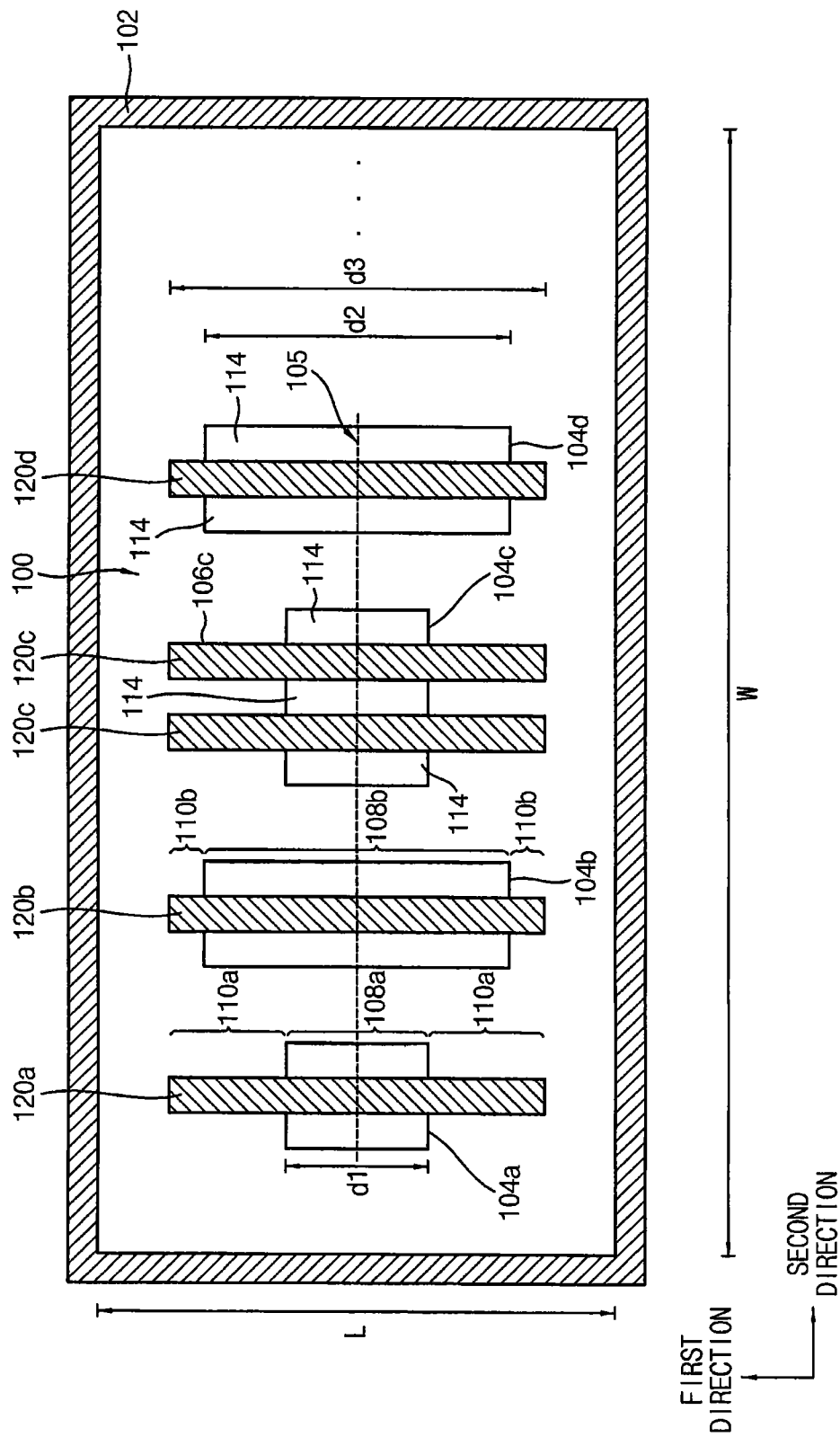

FIG. 3 is a plan view illustrating a semiconductor integrated circuit in accordance with example embodiments. The semiconductor integrated circuit of FIG. 3 may include substantially the same elements as those of FIG. 1 except for the shapes of the gate electrodes.

Referring to FIG. 3, the semiconductor integrated circuit may include a standard cell region 100, active regions 104a, 104b, 104c and 104d, gate electrodes 120a, 120b, 120c and 120d, and impurity regions 114. That is, the semiconductor integrated circuit may include MOS transistors in the active regions 104a, 104b, 104c and 104d, respectively.

In example embodiments, the standard cell region 100 and the active regions 104a, 104b, 104c and 104d may be substantially the same as or similar to those of FIG. 1, respectively. Therefore, at least one of the active regions 104a, 104b, 104c and 104d may have a length in the first direction different from a length/lengths of another/others. Also, center points of the active regions 104a, 104b, 104c and 104d in the first direction may be located on a first straight line 105 extending in the second direction. Therefore, each of the active regions 104a, 104b, 104c and 104d may be symmetric with respect to the first straight line 105.

As illustrated with reference to FIG. 1, reference numerals 104a, 104b, 104c and 104d may indicate first, second, third and fourth active regions, respectively. Each of the first and third active regions 104a and 104c may have a first length d1, and each of the second and fourth active regions 104b and 104d may have a second length d2 greater than the first length d1.

The gate electrodes 120a, 120b, 120c and 120d may extend in the first direction on the active regions 104a, 104b, 104c and 104d, respectively. Both end portions of each of the gate electrodes 120a, 120b, 120c and 120d in the first direction may be disposed on portions of the field region adjacent to both end portions of each of the active regions 104a, 104b, 104c and 104d in the first direction. The first to fourth gate electrodes 120a, 120b, 120c and 120d may be formed on the first to fourth active regions 104a, 104b, 104c and 104d, respectively.

The first to fourth gate electrodes 120a, 120b, 120c and 120d may be arranged in the second direction. Center points of the first to fourth gate electrodes 120a, 120b, 120c and 120d in the first direction may be located on a second straight line (e.g., line 105) extending in the second direction. Thus, the first to fourth gate electrodes 120a, 120b, 120c and 120d may be symmetric with respect to the second straight line. In FIG. 3, the second straight line may be identical to the first straight line 105. Alternatively, the second straight line may be different from the first straight line 105.

In example embodiments, the first to fourth gate electrodes 120a, 120b, 120c and 120d may have lengths in the first direction that are substantially the same, and thus both end portions of the gate electrodes 120a, 120b, 120c and 120d in the first direction may be aligned in the second direction.

Each of the first to fourth gate electrodes 120a, 120b, 120c and 120d may have a length greater than that of any of the active regions 104b and 104d. In example embodiments, each of the first to fourth gate electrodes 120a, 120b, 120c and 120d may have a third length d3 greater than the second length d2.

Each of the gate electrodes 120a, 120b, 120c and 120d may include a first portion 108a or 108b and second portions 110a or 110b. Each of the first portions 108a and 108b may be disposed on the active regions 104a, 104b, 104c and 104d, and each of the second portions 110a and 110b may be disposed on the field region. Each of the second portions 110a of each of the first and third gate electrodes 120a and 120c may have a length in the first direction greater than that of the second portions 110b of each of the second and fourth gate electrodes 120b and 120d.

As the gate electrodes 120a, 120b, 120c and 120d may have the same length in the first direction, no loading effect area due to the pattern density difference may be formed. Therefore, the loading effect may be reduced during the etching process used to form the gate electrodes 120a, 120b, 120c and 120d. Also, the gate electrodes 120a, 120b, 120c and 120d may be formed to have a width in the second direction that may be uniform in the first direction.

Impurity regions 114 may be formed at upper portions of each of the active regions 104a, 104b, 104c and 104d adjacent to (and on opposite sides of) the gate electrodes 120a, 120b, 120c and 120d. Impurity regions 114 may serve as source/drain regions of each of the MOS transistors.

As illustrated above, in accordance with example embodiments, the center points in the first direction of the active regions 104a, 104b, 104c and 104d may be located on the first straight line 105 extending in the second direction, and the gate electrodes 120a, 120b, 120c and 120d on the active regions 104a, 104b, 104c and 104d, respectively, may have lengths that are substantially the same. Due to the above-described layout of the active regions 104a, 104b, 104c and 104d and the gate electrodes 120a, 120b, 120c and 120d, the semiconductor integrated circuit may have a reduced loading effect, and may have desired and/or improved operation characteristics.

Figure 4:
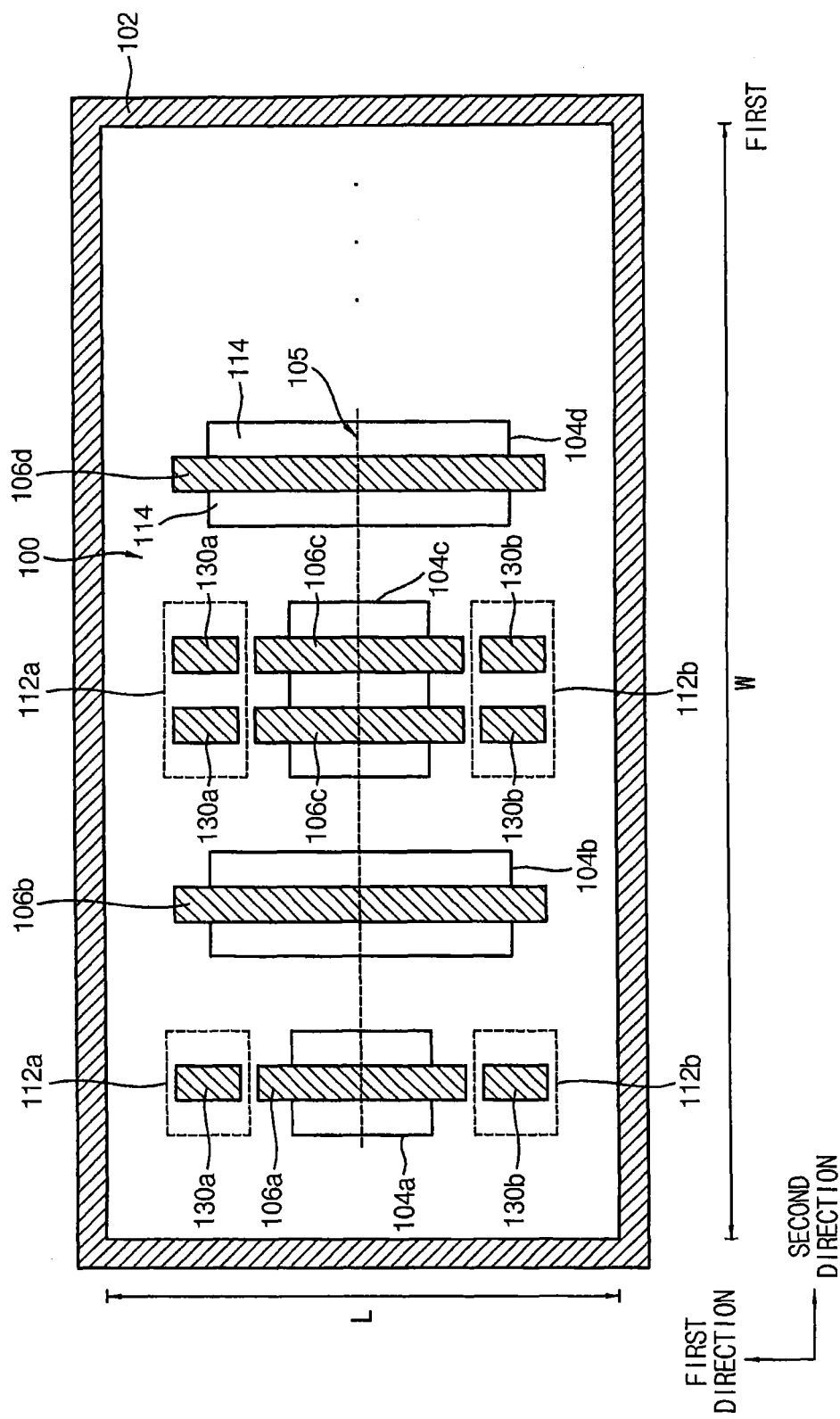

FIG. 4 is a plan view illustrating a semiconductor integrated circuit in accordance with example embodiments.

Referring to FIG. 4, the semiconductor integrated circuit may include a standard cell region 100, active regions 104a, 104b, 104c and 104d, gate electrodes 106a, 106b, 106c, and 106d, dummy patterns 130a and 130b, and impurity regions 114. That is, the semiconductor integrated circuit may include MOS transistors in the active regions 104a, 104b, 104c and 104d, respectively.

The semiconductor integrated circuit of FIG. 4 may include substantially the same elements as those of FIG. 1, with the addition of dummy patterns.

That is, at least one of the active regions 104a, 104b, 104c and 104d may have a length in the first direction different from a length/lengths of another/others. Also, center points of the active regions 104a, 104b, 104c and 104d in the first direction may be located on a first straight line 105 extending in the second direction. Thus, each of the active regions 104a, 104b, 104c and 104d may be symmetric with respect to the first straight line 105.

The gate electrodes 106a, 106b, 106c and 106d may extend in the first direction on the active regions 104a, 104b, 104c and 104d, respectively. Both end portions of each of the gate electrodes 106a, 106b, 106c and 106d in the first direction may be disposed on the field region. The first to fourth gate electrodes 106a, 106b, 106c and 106d may be formed on the first to fourth active regions 104a, 104b, 104c and 104d, respectively. Center points of the first to fourth gate electrodes 106a, 106b, 106c and 106d in the first direction may be located on a second straight line (e.g., line 105) extending in the second direction. Thus, each of the first to fourth gate electrodes 106a, 106b, 106c and 106d may be symmetric with respect to the second straight line. In FIG. 4, the second straight line may be identical to the first straight line 105. Alternatively, the second straight line may be different from the first straight line 105. At least one of the first to fourth gate electrodes 106a, 106b, 106c and 106d may have a length in the first direction different from a length/lengths of another/others.

Impurity regions 114 may be formed at upper portions of the active regions 104a, 104b, 104c and 104d adjacent to (and on opposite sides of) the gate electrodes 106a, 106b, 106c and 106d, respectively. Impurity regions 114 may serve as source/drain regions of each of the MOS transistors.

Dummy patterns 130a and 130b may be disposed on the field region adjacent to gate electrodes 106a and 106c. In example embodiments, a plurality of dummy patterns 130a and a plurality of dummy patterns 130b may be formed. Both portions of the field region adjacent to both end portions of each of the first and third gate electrodes 106a and 106c having a relatively short length may be referred to as first and second loading effect areas 112a and 112b, respectively. The dummy patterns 130a and 130b may be formed on the first and second loading effect areas 112a and 112b, respectively. The dummy patterns 130a and 130b may be formed to reduce a pattern density difference, and may not actually operate electrically.

Hereinafter, reference numerals 130a and 130b may indicate first and second dummy patterns, respectively. The first dummy patterns 130a may be formed on the first loading effect areas 112a, and the second dummy patterns 130b may be formed on the second loading effect areas 112b.

The first dummy patterns 130a may be spaced apart from first end portions of the first and third gate electrodes 106a and 106c, and may be aligned with the first and third gate electrodes 106a and 106c in the first direction. First end portions of the first dummy patterns 130a may be aligned in the second direction with first end portions of the gate electrodes having the longest length in the first direction among the gate electrodes 106a, 106b, 106c and 106d. That is, first end portions of first dummy patterns 130a may be aligned with the first end portions of the second and fourth gate electrodes 106b and 106d.

The second dummy patterns 130b may be spaced apart from second end portions of the first and third gate electrodes 106a and 106c, and may be aligned with the first and third gate electrodes 106a and 106c in the first direction. Second end portions of the second dummy patterns 130b may be aligned in the second direction with second end portions of the gate electrodes having the longest length among the gate electrodes 106a, 106b, 106c and 106d. That is, the second end portions of the second dummy patterns 130b may be aligned with the second end portions of the second and fourth gate electrodes 106b and 106d.

The first and second dummy patterns 130a and 130b may be formed on both portions of the field region adjacent to both end portions of each of the first and third gate electrodes 106a and 106c, respectively. The first and second dummy patterns 130a and 130b may have widths in the second direction substantially the same as those of the first and third gate electrodes 106a and 106c arranged in the first direction, respectively.

As described above, the first and second dummy patterns 130a and 130b may be formed on the first and second loading effect areas 112a and 112b, respectively, and thus the pattern density difference may be reduced. Therefore, the loading effect in an etching process used to form the gate electrodes 106a, 106b, 106c and 106d may be reduced, and each of the gate electrodes 106a, 106b, 106c and 106d may have a width in the second direction that may be uniform along its length in the first direction. As illustrated above, the semiconductor integrated circuit may have a reduced loading effect, and may have desired and/or improved operation characteristics.

Figure 5:
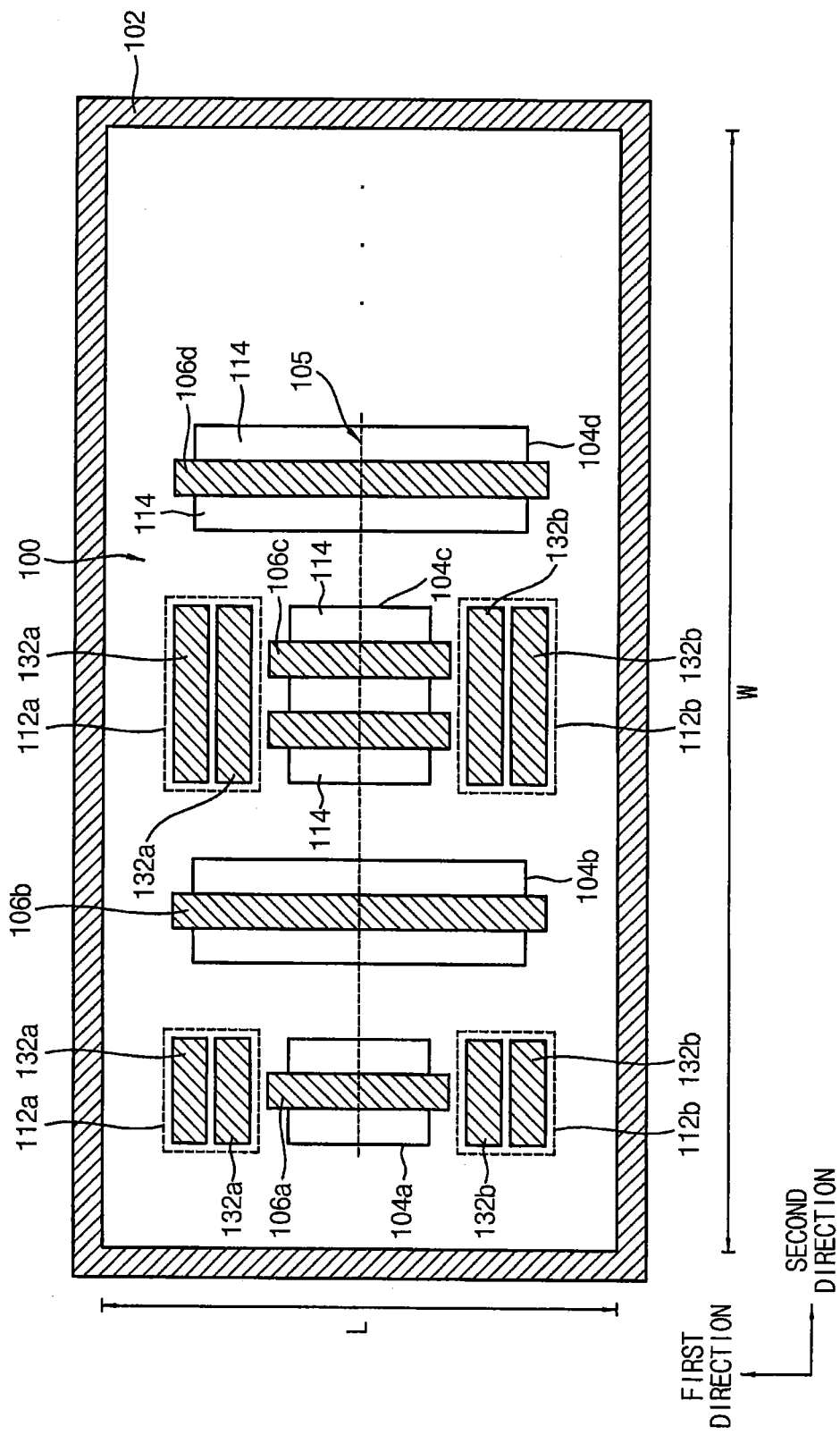
Figure 6:
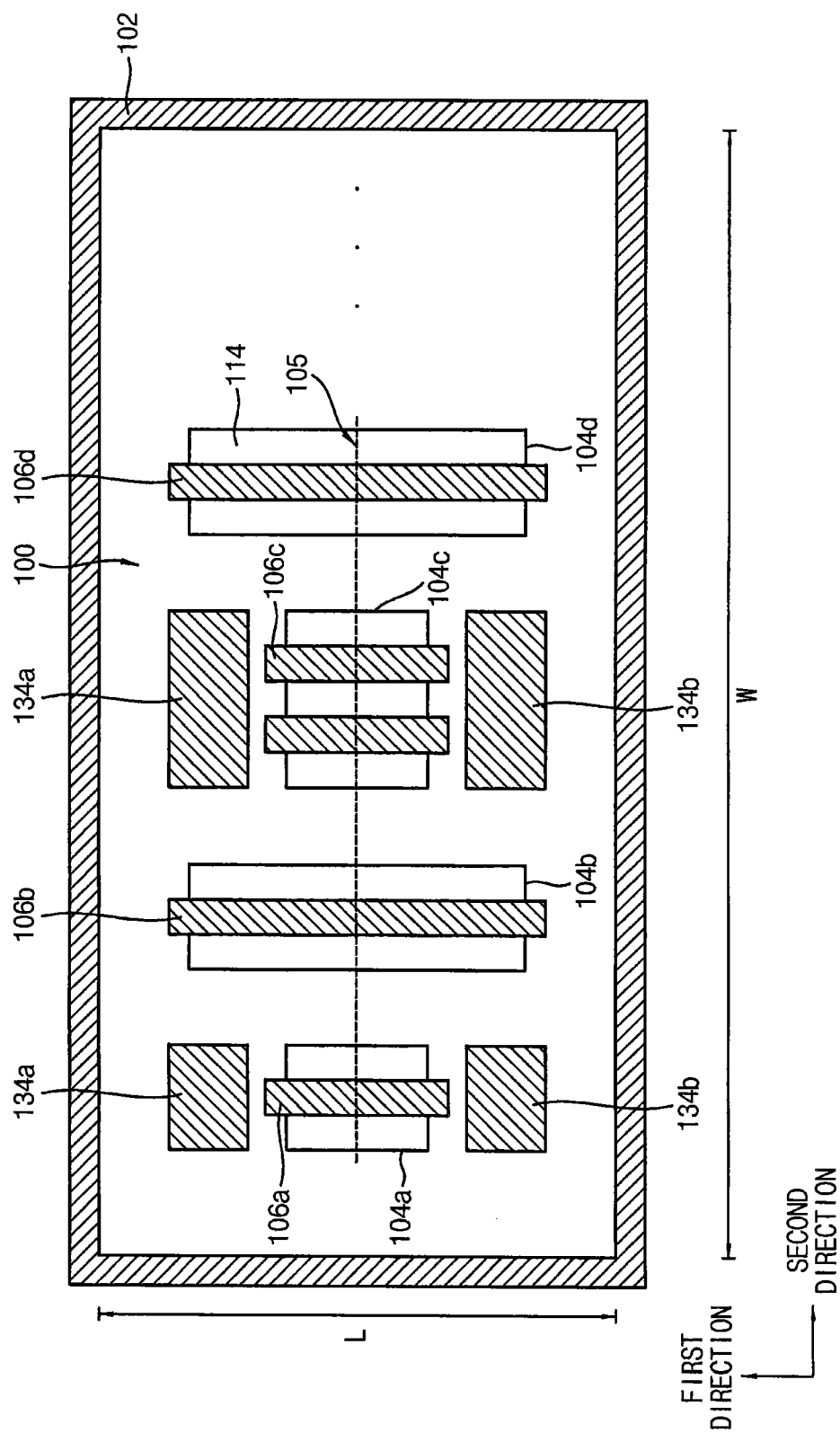

The dummy patterns 130a and 130b on the first and second loading effect areas 112a and 112b, respectively, may have various shapes, and may not be limited to those of the dummy patterns of FIG. 4. That is, the dummy patterns 130a and 130b may be formed to have various shapes in consideration of design convenience because the pattern density difference may be reduced by the existence of the dummy patterns 130a and 130b, regardless of the shapes of the dummy patterns 130a and 130b. FIGS. 5 and 6 illustrate semiconductor integrated circuits having dummy patterns of various shapes in accordance with example embodiments.

FIG. 5 is a plan view illustrating a semiconductor integrated circuit in accordance with example embodiments.

The semiconductor integrated circuit of FIG. 5 may include substantially the same elements as those of FIG. 4, except for the shapes of the dummy patterns.

Referring to FIG. 5, the semiconductor integrated circuit may include a standard cell region 100, active regions 104a, 104b, 104c and 104d, gate electrodes 106a, 106b, 106c, and 106d, dummy patterns 132a and 132b, and impurity regions 114.

First loading effect areas 112a and second loading effect areas 112b may be disposed on portions of the field region adjacent to both end portions of each of the gate electrodes 106a and 106c having a relatively short length in the first direction, respectively.

In example embodiments, a plurality of first dummy patterns 132a and a plurality of second dummy patterns 132b may be formed, and the first and second dummy patterns 132a and 132b may be formed on the first and second loading effect areas 112a and 112b, respectively. First dummy patterns 132a may be spaced apart from first end portions of each of the first and third gate electrodes 106a and 106c, and may extend in the second direction. The plurality of first dummy patterns 132a may be arranged in the first direction. A sidewall of a first dummy pattern most distant from each of the first and third active regions 104a and 104c in the first direction among the plurality of first dummy patterns 132a may be aligned with a first end portion of each of the second and fourth gate electrodes 106b and 106d in the second direction. Second dummy patterns 132b may be spaced apart from second end portions of each of the first and third gate electrodes 106a and 106c, and may extend in the second direction. A sidewall of a second dummy pattern most distant from each of the first and third active regions 104a and 104c in the first direction among the plurality of second dummy patterns 132b may be aligned with a second end portion of each of the second and fourth gate electrodes 106b and 106d in the second direction.

FIG. 6 is a plan view illustrating a semiconductor integrated circuit in accordance with example embodiments.

The semiconductor integrated circuit of FIG. 6 may include substantially the same elements as those of FIG. 4, except for the shapes of the dummy patterns.

Referring to FIG. 6, the semiconductor integrated circuit may include a standard cell region 100, active regions 104a, 104b, 104c and 104d, gate electrodes 106a, 106b, 106c, and 106d, dummy patterns 134a and 134b, and impurity regions 114.

First loading effect areas 112a and second loading effect areas 112b may be disposed on portions of the field region adjacent to both end portions of each of the gate electrodes 106a and 106c having a relatively short length in the first direction, respectively.

In example embodiments, a plurality of first dummy patterns 134a and a plurality of second dummy patterns 134b may be formed, and the first and second dummy patterns 132a and 132b may be formed on the first and second loading effect areas 112a and 112b, respectively. First dummy patterns 134a may be spaced apart from first end portions of each of the first and third gate electrodes 106a and 106c, and may cover most of the first loading effect area 112a. Second dummy patterns 134b may be spaced apart from second end portions of each of the first and third gate electrodes 106a and 106c, and may cover most of the second loading effect areas 112b. Therefore, a size of each of the first and second dummy patterns 134a and 134c may be changed according to an area of each of the first and second loading effect areas 112a and 112b, respectively.

Figure 7:
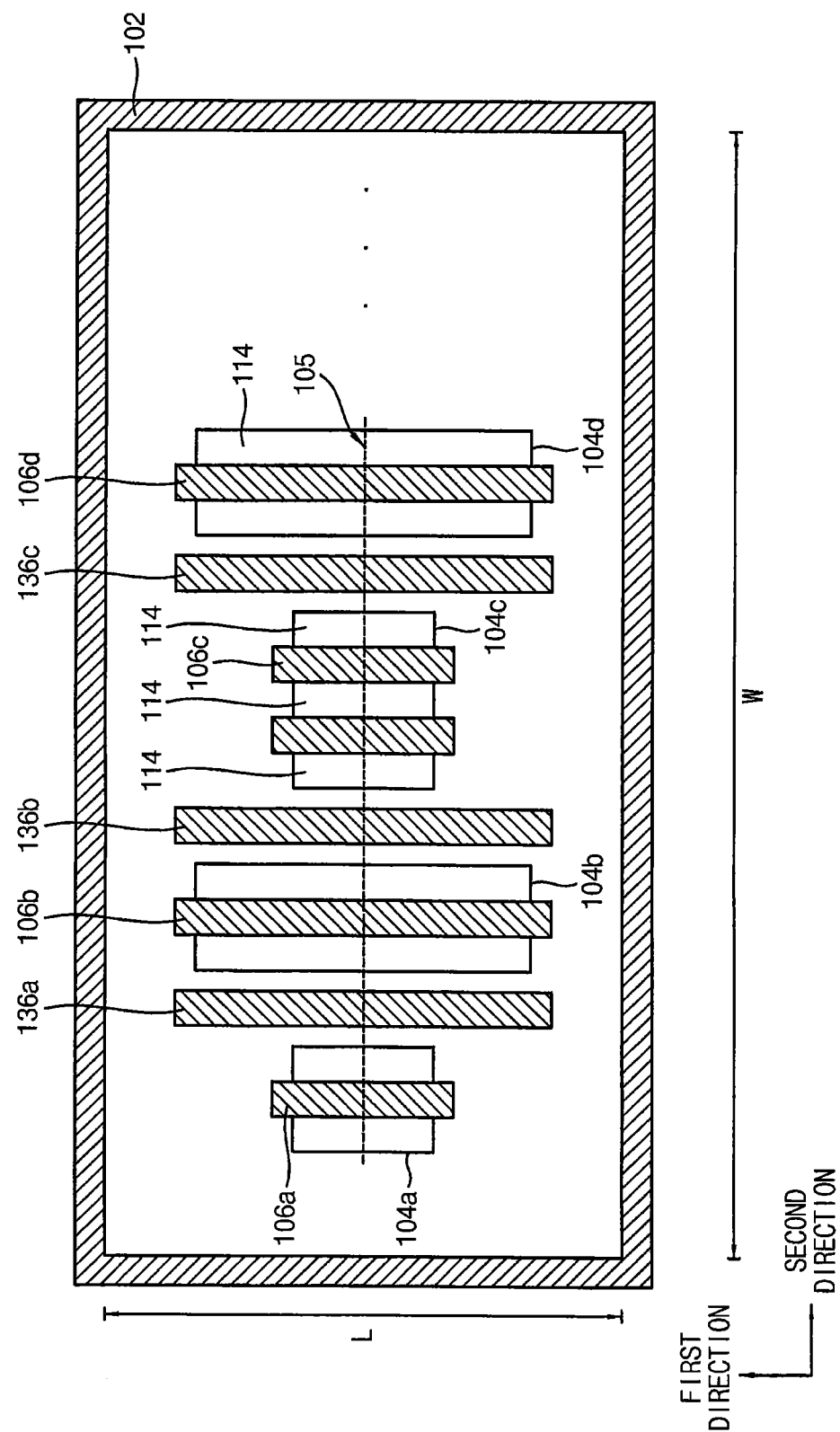

FIG. 7 is a plan view illustrating a semiconductor integrated circuit in accordance with example embodiments.

The semiconductor integrated circuit of FIG. 7 may include substantially the same elements as those of FIG. 1 except for dummy patterns.

Referring to FIG. 7, the semiconductor integrated circuit may include a standard cell region 100, active regions 104a, 104b, 104c and 104d, gate electrodes 106a, 106b, 106c, and 106d, dummy patterns 136a, 136b and 134c, and impurity regions 114.

The active regions 104a, 104b, 104c and 104d may be spaced apart from each other in the second direction.

Each of the dummy patterns 136a, 136b and 136c extending in the first direction may be formed on a field region between the first to fourth active regions 104a, 104b, 104c and 104d disposed in the second direction, and may be parallel to the gate electrodes 106a, 106b, 106c, and 106d. The dummy patterns 136a, 136b and 136c may be formed to compensate for pattern density differences of the gate electrodes 106a, 106b, 106c, and 106d in the second direction.

Due to the dummy patterns 136a, 136b and 136c, the gate electrodes 106a, 106b, 106c, and 106d and the dummy patterns 136a, 136b and 136c may be arranged in the second direction at a constant distance therebetween. Thus, the loading effect may be reduced during the etching process used to form the gate electrodes 106a, 106b, 106c and 106d. Also, the semiconductor integrated circuit may have desired and/or improved operation characteristics.

In example embodiments, the semiconductor integrated circuit may include elements shown in FIG. 4, FIG. 5 and/or FIG. 6, together with the dummy patterns extending in the first direction as shown in FIG. 7.

FIG. 8 is a plan view illustrating a semiconductor integrated circuit in accordance with example embodiments.

The semiconductor integrated circuit of FIG. 8 may have a standard cell including an NMOS transistor and a PMOS transistor.

Referring to FIG. 8, the semiconductor integrated circuit may include a first standard cell region 200 and a second standard cell region 250. The second standard cell region 250 may have a size substantially the same as or different from that of the first standard cell region 200.

First active regions 204a, 204b, 204c and 204d, first gate electrodes 206a, 206b, 206c and 206d, and first impurity regions 214 may be formed in the first standard cell region 200. Second active regions 254a, 254b, 254c and 254d, second gate electrodes 256a, 256b, 256c and 256d, and second impurity regions 264 may be formed in the second standard cell region 250.

First transistors of a first conductivity type may be formed in the first standard cell region 200, and second transistors of a second conductivity type different from the first conductivity type may be formed in the second standard cell region 250. In example embodiments, the first transistors may be NMOS transistors, and the second transistors may be PMOS transistors. In example embodiments, the second standard cell region 250 may be disposed to be parallel with the first standard cell region 200 in the first direction. In addition or in an alternative, the second standard cell region 250 may be disposed to be parallel with the first standard cell region 200 in the second direction.

The first standard cell region 200 may be defined as a region surrounded by a first guard ring 202, which may be doped with impurities and have a rectangular ring shape. The first guard ring 202 may be doped with impurities having a conductivity type different from that of the first transistors in the first standard cell region 200. In example embodiments, the first guard ring 202 may be doped with P-type impurities. The second standard cell region 250 may be defined as a region surrounded by a second guard ring 252, which may be doped with impurities and which may have a rectangular ring shape. The second guard ring 252 may be doped with impurities having a conductivity type different from that of the second transistors in the second standard cell region 250. In example embodiments, the second guard ring may be doped with N-type impurities.

The first active regions 204a, 204b, 204c, and 204d and the first gate electrodes 206a, 206b, 206c, and 206d in the first standard cell region 200 may be disposed substantially the same as or similar to those illustrated with reference to FIG. 1, respectively. Additionally, the second active regions 254a, 254b, 254c and 254d and the second gate electrodes 256a, 256b, 256c and 256d in the second standard cell regions 250 may be disposed substantially the same as or similar to those illustrated with reference to FIG. 1.

The first active regions 204a, 204b, 204c and 204d may be arranged in the second direction in the first standard cell region 200. At least one of the first active regions 204a, 204b, 204c and 204d may have a length in the first direction different from a length/lengths of another/others. Center points of the first active regions 204a, 204b, 204c and 204d in the first direction may be located on a first straight line 205 extending in the second direction. Therefore, each of the first active regions 204a, 204b, 204c and 204d may be symmetric with respect to the first straight line 205.

The first gate electrodes 206a, 206b, 206c and 206d may extend in the first direction on the first active regions 204a, 204b, 204c and 204d, respectively. End portions of each of the first gate electrodes 206a, 206b, 206c and 206d in the first direction may be disposed on portions of a field region. Center points of the first gate electrodes 206a, 206b, 206c and 206d in the first direction may be located on a second straight line (e.g., line 205) extending in the second direction. Therefore, each of the first gate electrodes 206a, 206b, 206c and 206d may be symmetric with respect to the second straight line. In FIG. 8, the second straight line may be identical to the first straight line 205. Alternatively, the second straight line may be different from the first straight line 205.

First pad patterns 208 may be connected with respective end portions of the first gate electrodes 206a, 206b, 206c and 206d. Each first pad pattern 208 may have a width different from widths of the first gate electrodes 206a, 206b, 206c and 206d. In example embodiments, each first pad pattern 208 may have a width in the second direction greater than widths of the first gate electrodes 206a, 206b, 206c and 206d.

First impurity regions 214 may be formed at upper portions of each of the first active regions 204a, 204b, 204c and 204d adjacent to (and on opposite sides of) the first gate electrodes 206a, 206b, 206c and 206d, respectively. First impurity regions 214 may be doped with N-type impurities. First impurity regions 214 may serve as source/drain regions of the first transistors. Therefore, NMOS transistors may be formed on the first active regions, respectively.

The second active regions 254a, 254b, 254c and 254d may be arranged in the second direction in the second standard cell region 250. At least one of the second active regions 254a, 254b, 254c and 254d may have a length in the first direction different from a length/lengths of another/others. Center points of the second active regions 254a, 254b, 254c and 254d in the first direction may be located on a third straight line 255 extending in the second direction. Therefore, each of the second active regions 254a, 254b, 254c and 254d may be symmetric with respect to the third straight line 255.

The second gate electrodes 256a, 256b, 256c and 256d may extend in the first direction on the second active regions 254a, 254b, 254c and 254d, respectively. End portions of each of the second gate electrodes 256a, 256b, 256c and 256d in the first direction may be disposed on portions of a field region. Center points of the second gate electrodes 256a, 256b, 256c and 256d in the first direction may be located on a fourth straight line extending in the second direction. Therefore, each of the second gate electrodes 256a, 256b, 256c and 256d may be symmetric with respect to the fourth straight line. In FIG. 8, the fourth straight line may be identical to the third straight line 255. Alternatively, the fourth straight line may be different from the third straight line 255.

Second pad patterns 258 may be connected with respective end portions of the second gate electrodes 256a, 256b, 256c and 256d. The second pad patterns 258 may have a width different from those of the second gate electrodes 256a, 256b, 256c and 256d. In example embodiments, the second pad patterns 258 may have a width in the second direction greater than those of the second gate electrodes 256a, 256b, 256c and 256d.

Second impurity regions 264 may be formed at upper portions of each of the second active regions 254a, 254b, 254c and 254d adjacent to (and on opposite sides of) the second gate electrodes 256a, 256b, 256c and 256d, respectively. The second impurity regions 264 may be doped with P-type impurities. The second impurity regions 264 may serve as source/drain regions of the second transistors. Therefore, PMOS transistors may be formed on the second active regions, respectively.

Wiring structures (not shown) may be electrically connected with the NMOS transistors in the first standard cell region 200 and the PMOS transistors in the second standard cell region 250, and thus the semiconductor integrated circuit may be a CMOS device.

Due to the above-described layout of the first and second active regions 204a, 204b, 204c, 204d, 254a, 254b, 254c, and 254d, and the first and second gate electrodes 206a, 206b, 206c, 206d, 266a, 266b, 266c and 266d, the semiconductor integrated circuit may have a reduced loading effect, and may have desired and/or improved operation characteristics.

FIG. 9 is a plan view illustrating a semiconductor integrated circuit in accordance with example embodiments.

The semiconductor integrated circuit of FIG. 9 may have a standard cell structure including NMOS and PMOS transistors. The semiconductor integrated circuit of FIG. 9 may include substantially the same elements as those of FIG. 8 except for the shapes of first and second gate electrodes.

Referring to FIG. 9, the semiconductor integrated circuit may include a first standard cell region 200 and a second standard cell region 250. First active regions 204a, 204b, 204c, and 204d, first gate electrodes 220a, 220b, 220c and 220d, and first impurity regions 214 may be formed in the first standard cell region 200. Second active regions 254a, 254b, 254c and 254d, second gate electrodes 270a, 270b, 270c and 270d, and second impurity regions 264 may be formed in the second standard cell region 250.

In example embodiments, the first and second active regions 204a, 204b, 204c, 204d, 254a, 254b, 254c and 254d in the first and second standard cell regions 200 and 250, respectively, may be substantially the same as or similar to those of FIG. 8. Also, the first and second gate electrodes 220a, 220b, 220c, 220d, 270a, 270b, 270c and 270d in the first and second standard cell regions 200 and 250, respectively, may be disposed identically or similarly to the gate electrodes of FIG. 3.

The first gate electrodes 220a, 220b, 220c and 220d may have a first length in the first direction substantially the same as each other, and thus both end portions of the first gate electrodes 220a, 220b, 220c and 220d in the first direction may be aligned with the second direction, respectively. Also, center points of the first gate electrodes 220a, 220b, 220c and 220d in the first direction may be located on a straight line (e.g., line 205) extending in the second direction.

The first length may be greater than that of the first active region 204c having the longest length among the first active regions 204a, 204b, 204c and 204d.

First pad patterns 208 may be connected with respective end portions of the first gate electrodes 220a, 220b, 220c and 220d. The first pad patterns 208 may have a width different from those of the first gate electrodes 220a, 220b, 220c and 220d.

The second gate electrodes 270a, 270b, 270c and 270d may have a second length in the first direction substantially the same as each other, and thus both end portions of the second gate electrodes 270a, 270b, 270c and 270d in the first direction may be aligned with the second direction, respectively. Also, center points of the second gate electrodes 270a, 270b, 270c and 270d in the first direction may be located on a straight line (e.g., line 255) extending in the second direction.

The second length may be greater than that of the second active regions 254a, 254b and 254d having the longest length among the second active regions 254a, 254b, 254c and 254d.

Second pad patterns 258 may be connected with respective end portions of the second gate electrodes 270a, 270b, 270c and 270d. The second pad patterns 258 may have a width different from those of the second gate electrodes 270a, 270b, 270c and 270d.

Wiring structures (not shown) may be electrically connected with the NMOS transistors in the first standard cell region 200 and the PMOS transistors in the second standard cell region 250, and thus the semiconductor integrated circuit may be a CMOS device.

FIG. 10 is a plan view illustrating a semiconductor integrated circuit in accordance with example embodiments.

Referring to FIG. 10, the semiconductor integrated circuit may include a first standard cell region 200 and a second standard cell region 250. First active regions 204a, 204b, 204c and 204d, first gate electrodes 206a, 206b, 206c and 206d, first dummy patterns 210 and first impurity regions 214 may be formed in the first standard cell region 200. Second active regions 254a, 254b, 254c and 254d, second gate electrodes 256a, 256b, 256c and 256d, second dummy patterns 260 and second impurity regions 264 may be formed in the second standard cell region 250. The semiconductor integrated circuit of FIG. 10 may include substantially the same elements as those of FIG. 8 except for the first and second dummy patterns.

The first dummy patterns 210 may be disposed on the field region adjacent respective first gate electrodes 206a, 206b, 206c and 206d in the first standard cell region 200. The first dummy patterns 210 may be disposed to compensate for the pattern density difference of the first gate electrodes 206a, 206b, 206c and 206d. In example embodiments, the first dummy pattern 210 may be disposed on portions of the field region adjacent to both end portions of each of the first gate electrodes 206a, 206b and 206d having a relatively short length among the first gate electrodes 206a, 206b, 206c and 206d.

Second dummy patterns 260 may be disposed on the field region adjacent respective second gate electrodes 256a, 256b, 256c and 256d in the second standard cell region 250. The second dummy patterns 260 may be disposed to compensate for the pattern density difference of the second gate electrodes 256a, 256b, 256c and 256d. In example embodiments, the second dummy patterns 260 may be disposed on portions of the field region adjacent to both end portions of the second gate electrode 256c having a relatively short length among the second gate electrodes 256a, 256b, 256c and 256d.

Due to the first and second dummy patterns 210 and 260, an area having the pattern density difference in each of the first and second standard cell regions 200 and 250 may be reduced.

Each of the first and second dummy patterns 210 and 260 may be spaced apart from both end portions of each of the first and second gate electrodes 206a, 206b, 206d, and 256c. In example embodiments, a plurality of first dummy patterns 210 may be arranged in the second direction, and a plurality of second dummy patterns 260 may be arranged in the second direction, as illustrated with reference to FIG. 10. The first and second dummy patterns 210 and 260 may have various shapes, and the shapes may not be limited to those of the dummy patterns of FIG. 10.

Wiring structures (not shown) may be electrically connected with the NMOS transistors in the first standard cell region 200 and the PMOS transistors in the second standard cell region 250, and thus the semiconductor integrated circuit may be a CMOS device.

Figure 11:
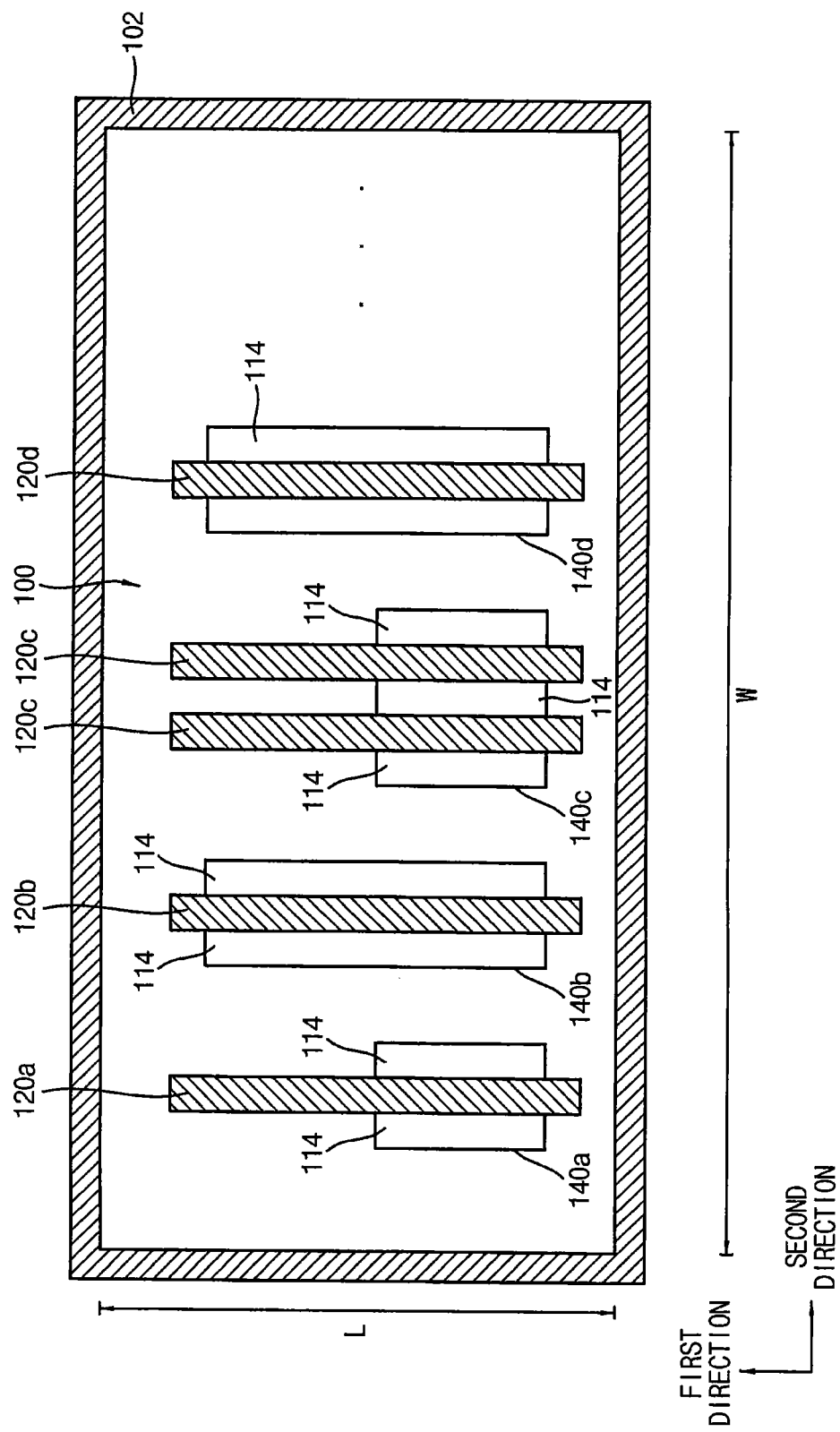

FIG. 11 is a plan view illustrating a semiconductor integrated circuit in accordance with example embodiments.

Referring to FIG. 11, the semiconductor integrated circuit may include a standard cell region 100, active regions 140a, 140b, 140c and 140d, gate electrodes 120a, 120b, 120c and 120d, and impurity regions 114.

In example embodiments, the standard cell region 100 may be substantially the same as or similar to that of FIG. 1.

The active regions 140a, 140b, 140c and 140d may be arranged in the standard cell region 100 in the second direction. Each of the active regions 140a, 140b, 140c and 140d may have a rectangular shape. At least one of the active regions 140a, 140b, 140c and 140d may have a length in the first direction different from a length/lengths of another/others. Lower end points of each of the active regions 140a, 140b, 140c and 140d in the first direction may be located on a straight line extending in the second direction.

The gate electrodes 120a, 120b, 120c and 120d may extend in the first direction on the active regions 140a, 140b, 140c and 140d, respectively. Both end portions of each of the gate electrodes 120a, 120b, 120c and 120d in the first direction may be disposed on portions of the field region. Reference numerals 140a, 140b, 140c and 140d may indicate first, second, third and fourth active regions, respectively, and reference numerals 120a, 120b, 120c and 120d may indicate first, second, third and fourth gate electrodes, respectively. The first to fourth gate electrodes 120a, 120b, 120c and 120d may be formed on the first to fourth active regions 140a, 140b, 140c and 140d, respectively.

The first to fourth gate electrodes 120a, 120b, 120c and 120d may be arranged in the second direction. Center points of the first to fourth gate electrodes 120a, 120b, 120c and 120d in the first direction may be located on a straight line extending in the second direction. Thus, each of the first to fourth gate electrodes 120a, 120b, 120c and 120d may be symmetric with respect to the straight line.

In example embodiments, the first to fourth gate electrodes 120a, 120b, 120c and 120d may have lengths in the first direction substantially the same as each other, and thus both end portions of the first to fourth gate electrodes 120a, 120b, 120c and 120d in the first direction may be aligned with the second direction, respectively.

The gate electrodes 120a, 120b, 120c and 120d may have substantially the same length in the first direction, and thus a loading effect area may be reduced. Therefore, the loading effect may be reduced during the etching process used to form the gate electrodes 120a, 120b, 120c and 120d. Also, the gate electrodes 120a, 120b, 120c and 120d may be formed to have a uniform width in the second direction.

The impurity regions 114 may be formed at upper portions of each of active regions 140a, 140b, 140c and 140d adjacent to (and on opposite sides of) the gate electrodes 120a, 120b, 120c and 120d, respectively.

Due to the above-described layout of the active regions 140a, 140b, 140c and 140d and the gate electrodes 120a, 120b, 120c and 120d, the semiconductor integrated circuit may have a reduced loading effect, and may have desired and/or improved operation characteristics.

Figure 12:
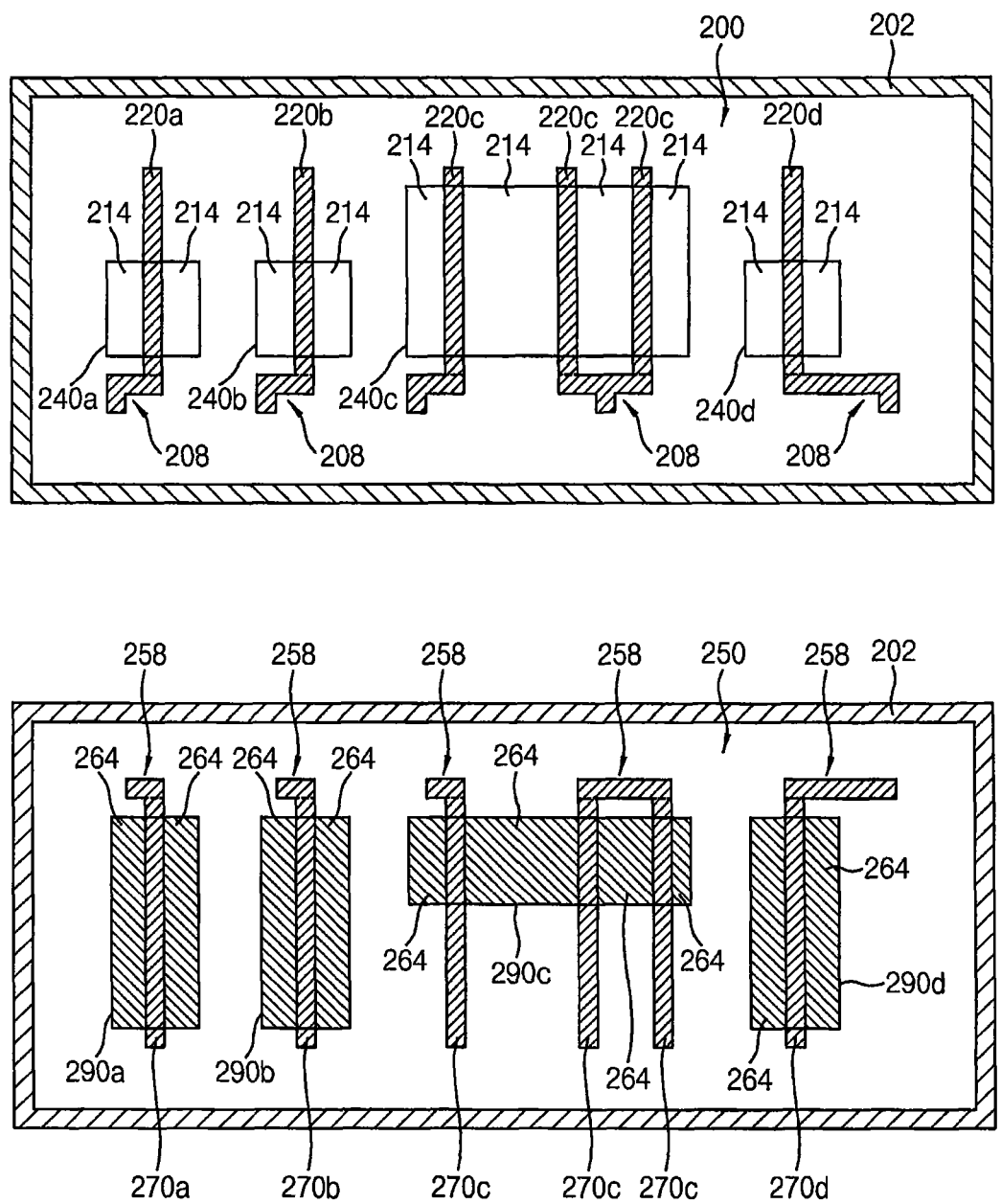

FIG. 12 is a plan view illustrating a semiconductor integrated circuit in accordance with example embodiments.

Referring to FIG. 12, the semiconductor integrated circuit may include a first standard cell region 200 and a second standard cell region 250. First active regions 240a, 240b, 240c and 240d, first gate electrodes 220a, 220b, 220c and 220d, and first impurity regions 214 may be formed in the first standard cell region 200. Second active regions 254a, 254b, 254c and 254d, second gate electrodes 256a, 256b, 256c and 256d, and second impurity regions 264 may be formed in the second standard cell region 250.

In example embodiments, the first and second standard cell regions 200 and 250 may be substantially the same as or similar to those of FIG. 8, respectively.

At least one of the first active regions 240a, 240b, 240c and 240d may have a length in the first direction different from a length/lengths of another/others. Lower end points of each of the active regions 240a, 240b, 240c and 240d in the first direction may be located on a straight line extending in the second direction.

The first gate electrodes 220a, 220b, 220c and 220d may extend in the first direction on the first active regions 240a, 240b, 240c and 240d, respectively. Each of the first gate electrodes 220a, 220b, 220c and 220d may have a first length in the first direction substantially the same as each other, and thus both end portions of the first gate electrodes 220a, 220b, 220c and 220d in the first direction may be aligned with the second direction. Also, center points of the first gate electrodes 220a, 220b, 220c and 220d in the first direction may be located on a straight line extending in the second direction.

First pad patterns 208 may be connected with respective end portions of the first gate electrodes 220a, 220b, 220c and 220d. The first pad patterns 208 may have a width in the second direction different from those of the first gate electrodes 220a, 220b, 220c and 220d.

The first impurity regions 214 may be formed at upper portions of each of the first active regions 240a, 240b, 240c and 240d adjacent to the first gate electrodes 220a, 220b, 220c and 220d, respectively.

At least one of the second active regions 270a, 270b, 270c and 270d may have a length in the first direction different from a length/lengths of another/others. Upper end points of each of the second active regions 290a, 290b, 290c and 290d in the first direction may be located on a straight line extending in the second direction.

The second gate electrodes 270a, 270b, 270c and 270d may extend in the first direction on the second active regions 290a, 290b, 290c and 290d, respectively. Each of the second gate electrodes 270a, 270b, 270c and 270d may have a second length in the first direction substantially the same as each other, and thus both end portions of the second gate electrodes 270a, 270b, 270c and 270d in the first direction may be aligned with the second direction. Also, center points of the second gate electrodes 270a, 270b, 270c and 270d in the first direction may be located on a straight line extending in the second direction.

Second pad patterns 258 may be connected with respective end portions of the second gate electrodes 270a, 270b, 270c and 270d. The first pad pattern 208 may have a width in the second direction different from those of the second gate electrodes 270a, 270b, 270c and 270d.

The second impurity regions 264 may be formed at upper portions of each of the first active regions 290a, 290b, 290c and 290d adjacent to (and on opposite sides of) the second gate electrodes 270a, 270b, 270c and 270d, respectively.

Wiring structures (not shown) may be electrically connected with the NMOS transistors in the first standard cell region 200 and the PMOS transistors in the second standard cell region 250, and thus the semiconductor integrated circuit may be a CMOS device.

Dummy patterns and gate electrodes disclosed herein may have a same structure. For example, a same layer or layers may be formed and patterned simultaneously to form dummy patterns and gate electrodes of an integrated circuit device according to some embodiments disclosed herein. Moreover, by reducing loading effect areas and/or providing dummy patterns as discussed above, line width uniformity may be improved when forming gate electrodes. In addition, a same layer or layers may be formed and patterned simultaneously to form gate electrodes, pad patterns, and/or dummy patterns.

The above-disclosed subject matter is to be considered illustrative and not restrictive, and the appended claims are intended to cover all such modifications, enhancements, and other embodiments, which fall within the true spirit and scope of inventive concepts disclosed herein. Thus, to the maximum extent allowed by law, the scope of the inventive concepts is to be determined by the broadest permissible interpretation of the following claims and their equivalents, and shall not be restricted or limited by the foregoing detailed description.

That which is claimed is:

1. A semiconductor integrated circuit device comprising:
a first active region on a surface of a substrate, wherein the first active region has a length in a first direction;
a second active region on the surface of the substrate, wherein the second active region has a length in the first direction, wherein the length of the second active region is greater than the length of the first active region, and wherein an axis in a second direction intersects centers of the first and second active regions so that the first and second active regions are symmetric about the axis in the second direction;
a first gate electrode that extends across the first active region in the first direction; and
a second gate electrode that extends across the second active region in the first direction.

2. The semiconductor integrated circuit device of claim 1, wherein the surface of the substrate includes a standard cell region, and the first and second active regions are disposed in the standard cell region.

3. The semiconductor integrated circuit device of claim 2 further comprising;
a guard ring surrounding the standard cell region, wherein the guard ring includes first and second sides extending in the first direction and third and fourth sides extending in the second direction.

4. The semiconductor integrated circuit device of claim 2 wherein the standard cell region is a first standard cell region and the axis is a first axis, the device further comprising:
first and second source/drain regions in the first active region on opposite sides of the first gate electrode wherein the first active region, the first gate electrode, and the first and second source/drain regions define a first MOS transistor of a first conductivity type;
third and fourth source/drain regions in the second active region on opposite sides of the second gate electrode wherein the second active region, the second gate electrode, and the third and fourth source/drain regions define a second NMOS transistor of the first conductivity type;
a second standard cell region on the surface of a substrate;
a third active region on the surface of the substrate in the second standard cell region;
a fourth active region on the surface of the substrate in the second standard cell region;
a third gate electrode that extends across the third active region in the first direction;
a fourth gate electrode that extends across the fourth active region in the first direction;
fifth and sixth source/drain regions in the third active region on opposite sides of the third gate electrode wherein the third active region, the third gate electrode, and the fifth and sixth source/drain regions define a first MOS transistor of a second conductivity type different than the first conductivity type; and
seventh and eighth source/drain regions in the fourth active region on opposite sides of the fourth gate electrode wherein the fourth active region, the fourth gate electrode, and the seventh and eighth source/drain regions define a second MOS transistor of the second conductivity type.

5. The semiconductor integrated circuit device of claim 1 wherein the first and second directions are orthogonal.

6. The semiconductor integrated circuit device of claim 1 wherein a length of the first gate electrode in the first direction is greater than the length of the first active region in the first direction, and wherein a length of the second gate electrode in the first direction is greater than the length of the second active region in the first direction.

7. The semiconductor integrated circuit device of claim 6 wherein the length of the first gate electrode in the first direction is less than the length of the second gate electrode in the first direction.

8. The semiconductor integrated circuit device of claim 7 wherein the length of the first gate electrode in the first direction is less than the length of the second active region in the first direction.

9. The semiconductor integrated circuit device of claim 7 further comprising:
first and second dummy gate patterns at opposite ends of the first gate electrode and spaced apart from the first gate electrode, so that the first gate electrode is arranged between the first and second dummy gate patterns in the first direction.

10. The semiconductor integrated circuit device of claim 6 wherein the lengths of the first and second gate electrodes in the first direction are the same.

11. The semiconductor integrated circuit device of claim 1 further comprising:
a field region on the surface of the substrate surrounding the first and second active regions.

12. The semiconductor integrated circuit device of claim 11 further comprising:
a dummy gate pattern on the field region between the first and second active regions, wherein the dummy gate pattern extends across the field region, in the first direction in parallel with the first and second gate electrodes.

13. The semiconductor integrated circuit device of claim 12 wherein a distance between the first gate electrode and the dummy gate pattern in the second direction is the same as a distance between the dummy gate pattern and the second gate electrode in the second direction.

14. The semiconductor integrated circuit device of claim 1 wherein the axis in the second direction intersects centers of the first and second gate electrodes so that the first and second gate electrodes are symmetric about the axis in the second direction.

15. The semiconductor integrated circuit device of claim 14 wherein lengths of the first, and second gate electrodes in the first direction are different.

16. A semiconductor integrated circuit device comprising:
a first active region on a surface of a substrate, wherein the first active region has a length in a first direction;
a second active region on the surface of the substrate, wherein the second active region has a length in the first direction, and wherein the length of the second active region is greater than the length of the first active region;
a first gate electrode that extends across the first active region in the first direction, wherein the first gate electrode has a length in the first direction;
a second gate electrode that extends across, the second active region in the first direction wherein the second gate electrode has a length in the first direction that is greater than the length of the first gate electrode in the first direction wherein the first and second gate electrodes are parallel in the first direction, wherein the first and second gate electrode are spaced apart in a second direction and wherein the first and second directions are orthogonal;
a first dummy gate pattern spaced apart from the first gate electrode; and
a second dummy gate pattern spaced apart from the first gate electrode, wherein the first gate electrode is arranged between the first and second dummy gate patterns in the first direction,
wherein a first axis in the first direction intersects the first gate electrode and the first and second dummy patterns, and
wherein a second axis in a second direction intersects the first and second gate electrodes.

17. The semiconductor integrated circuit device of claim 16 further comprising:
a field region on the surface of the substrate surrounding the first and second active regions.

18. The semiconductor integrated circuit device of claim 17 further comprising:
a third dummy gate pattern on the field region between the first and second active regions, wherein the third dummy gate pattern extends across the field region in the first direction in parallel with the first and second gate electrodes.

19. The semiconductor integrated circuit device of claim 18 wherein a distance between the first gate electrode and the third dummy gate pattern in the second direction is the same as a distance between the third dummy gate pattern and the second gate electrode in the second direction.

20. A. semiconductor integrated circuit device comprising:
a first active region on a surface of a substrate;
a second active region on the surface of the substrate;
a field region on the surface of the substrate surrounding the first and second active regions;
a first gate electrode that extends across the first active region in a first direction;
a second gate electrode that extends across the second active region in the first direction; and
a dummy gate pattern on the field region between the first and second active regions, wherein the dummy gate pattern extends across the field region in the first direction in parallel with the first and second gate electrodes, wherein an axis in a second direction intersects center points of the first gate electrode, the second gate electrode, and the dummy gate pattern.

* * * * *